United States Patent
Inoue et al.

(10) Patent No.: US 10,475,844 B2
(45) Date of Patent: Nov. 12, 2019

(54) PHOTOELECTRIC CONVERSION DEVICE, PHOTOELECTRIC CONVERSION METHOD, AND IMAGE FORMING APPARATUS

(71) Applicants: Keita Inoue, Kanagawa (JP); Masamoto Nakazawa, Kanagawa (JP); Hiroki Shirado, Kanagawa (JP)

(72) Inventors: Keita Inoue, Kanagawa (JP); Masamoto Nakazawa, Kanagawa (JP); Hiroki Shirado, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/831,509

(22) Filed: Dec. 5, 2017

(65) Prior Publication Data
US 2018/0175096 A1 Jun. 21, 2018

(30) Foreign Application Priority Data
Dec. 20, 2016 (JP) .................................. 2016-246959

(51) Int. Cl.
| | |
|---|---|
| *H04N 1/40* | (2006.01) |
| *H01L 27/146* | (2006.01) |
| *H04N 1/12* | (2006.01) |
| *H04N 1/19* | (2006.01) |

(52) U.S. Cl.
CPC ....... *H01L 27/14643* (2013.01); *H04N 1/126* (2013.01); *H04N 1/1906* (2013.01); *H04N 1/40056* (2013.01)

(58) Field of Classification Search
CPC .............................. H04N 1/6002; H04N 1/126
See application file for complete search history.

(56) References Cited

U.S. PATENT DOCUMENTS

| | | | | |
|---|---|---|---|---|
| 2005/0094222 A1* | 5/2005 | Tseng | ..................... | H04N 1/031 358/483 |
| 2006/0231733 A1* | 10/2006 | Boemler | .............. | H04N 5/3575 250/208.1 |
| 2007/0188638 A1* | 8/2007 | Nakazawa | ............. | H04N 1/193 348/294 |
| 2008/0252787 A1* | 10/2008 | Nakazawa | .......... | H03M 1/0607 348/572 |
| 2009/0180014 A1* | 7/2009 | Noda | ................... | H04N 5/3452 348/308 |

(Continued)

FOREIGN PATENT DOCUMENTS

| | | |
|---|---|---|
| JP | 2007-124144 | 5/2007 |
| JP | 2007124144 A * | 5/2007 |

(Continued)

OTHER PUBLICATIONS

U.S. Appl. No. 15/790,101, filed Oct. 23, 2017, Hiroki Shirado, et al.

(Continued)

*Primary Examiner* — Ted W Barnes
(74) *Attorney, Agent, or Firm* — Oblon, McClelland, Maier & Neustadt, L.L.P.

(57) ABSTRACT

A photoelectric conversion device includes a generation circuit and a controller. The generation circuit generates an image signal according to an intensity of light being input. The controller controls the generation circuit to generate a dark-time image signal equivalent to an image signal generated by the generation circuit without exposure to external light.

11 Claims, 21 Drawing Sheets

(56) References Cited

U.S. PATENT DOCUMENTS

| | | | |
|---|---|---|---|
| 2010/0027061 A1* | 2/2010 | Nakazawa | H04N 5/3577 358/1.15 |
| 2010/0171998 A1 | 7/2010 | Nakazawa | |
| 2011/0026083 A1 | 2/2011 | Nakazawa | |
| 2011/0051201 A1 | 3/2011 | Hashimoto et al. | |
| 2011/0063488 A1 | 3/2011 | Nakazawa | |
| 2011/0216223 A1* | 9/2011 | Nakamura | H04N 5/335 348/231.99 |
| 2012/0057211 A1* | 3/2012 | Shirado | H04N 1/00811 358/475 |
| 2012/0105695 A1* | 5/2012 | Iida | H03G 5/28 348/301 |
| 2013/0063792 A1 | 3/2013 | Nakazawa | |
| 2014/0029065 A1* | 1/2014 | Nakazawa | H04N 1/407 358/461 |
| 2014/0036118 A1* | 2/2014 | Dowaki | H04N 5/2173 348/294 |
| 2014/0043629 A1 | 2/2014 | Shirado | |
| 2014/0191290 A1* | 7/2014 | Funao | H01L 27/14603 257/231 |
| 2014/0204427 A1 | 7/2014 | Nakazawa | |
| 2014/0204432 A1 | 7/2014 | Hashimoto et al. | |
| 2014/0211273 A1* | 7/2014 | Konno | H04N 1/0408 358/482 |
| 2014/0284491 A1* | 9/2014 | Sato | G01T 1/247 250/393 |
| 2014/0368893 A1 | 12/2014 | Nakazawa et al. | |
| 2015/0098117 A1* | 4/2015 | Marumoto | H04N 1/4076 358/474 |
| 2015/0116794 A1 | 4/2015 | Nakazawa | |
| 2015/0163378 A1* | 6/2015 | Konno | H04N 1/486 358/483 |
| 2015/0222790 A1 | 8/2015 | Asaba et al. | |
| 2015/0288837 A1* | 10/2015 | Morikawa | H04N 1/00729 358/474 |
| 2015/0304517 A1 | 10/2015 | Nakazawa et al. | |
| 2016/0003673 A1 | 1/2016 | Hashimoto et al. | |
| 2016/0006961 A1 | 1/2016 | Asaba et al. | |
| 2016/0088179 A1 | 3/2016 | Nakazawa et al. | |
| 2016/0112660 A1 | 4/2016 | Nakazawa et al. | |
| 2016/0119495 A1 | 4/2016 | Konno et al. | |
| 2016/0173719 A1 | 6/2016 | Hashimoto et al. | |
| 2016/0219163 A1 | 7/2016 | Shirado et al. | |
| 2016/0268330 A1 | 9/2016 | Nakazawa et al. | |
| 2016/0295138 A1 | 10/2016 | Asaba et al. | |
| 2016/0373604 A1 | 12/2016 | Hashimoto et al. | |
| 2017/0019567 A1 | 1/2017 | Konno et al. | |
| 2017/0163836 A1 | 6/2017 | Nakazawa | |
| 2017/0170225 A1 | 6/2017 | Asaba et al. | |
| 2017/0201700 A1 | 7/2017 | Hashimoto et al. | |
| 2017/0295298 A1 | 10/2017 | Ozaki et al. | |
| 2017/0302821 A1 | 10/2017 | Sasa et al. | |
| 2017/0324883 A1* | 11/2017 | Konno | H04N 1/486 |
| 2018/0146150 A1* | 5/2018 | Shirado | H04N 5/2173 |
| 2019/0029618 A1* | 1/2019 | Sato | G01T 7/00 |

FOREIGN PATENT DOCUMENTS

| | | |
|---|---|---|
| JP | 2014-216775 | 11/2014 |
| JP | 2014216775 A * | 11/2014 |
| JP | 2017-011418 | 1/2017 |

OTHER PUBLICATIONS

U.S. Appl. No. 15/600,156, filed May 19, 2017, Naoki Goh, et al.
U.S. Appl. No. 15/659,332, filed Jul. 25, 2017 Yoshio Konno, et al.

* cited by examiner

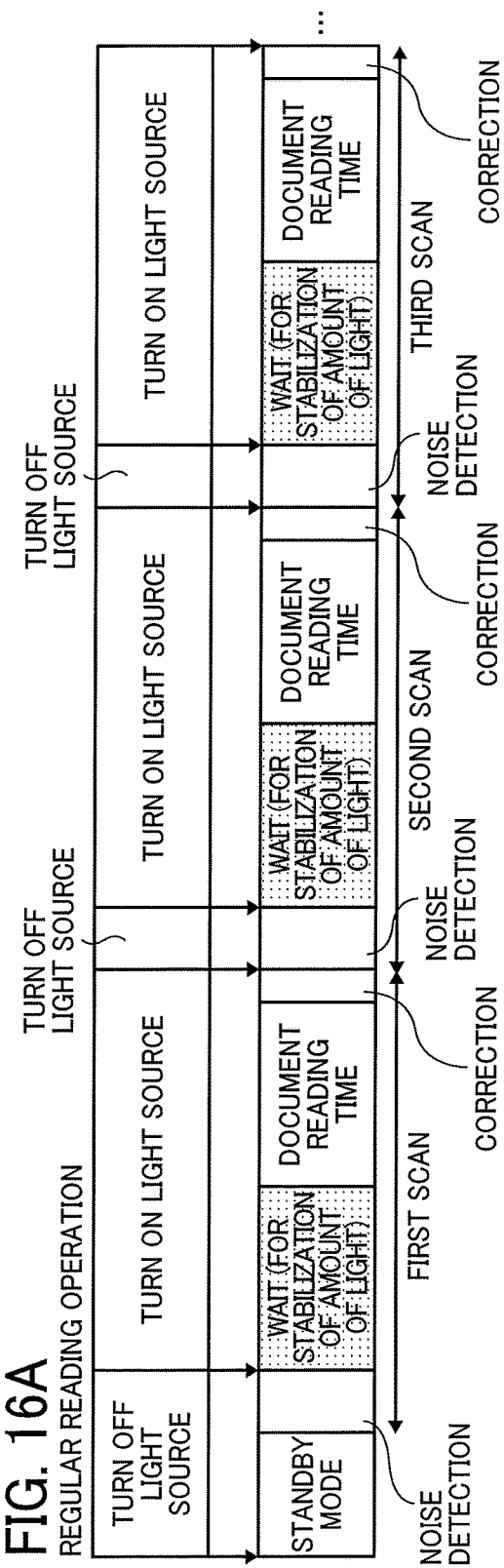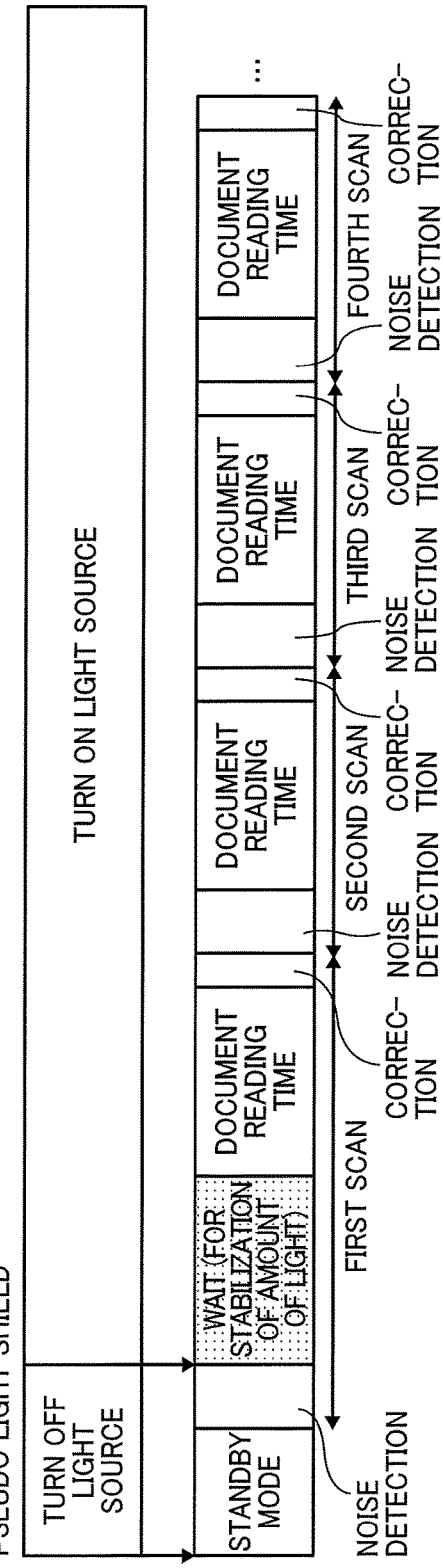

PHOTOELECTRIC CONVERSION DEVICE, PHOTOELECTRIC CONVERSION METHOD, AND IMAGE FORMING APPARATUS

CROSS-REFERENCE TO RELATED APPLICATION

This patent application is based on and claims priority pursuant to 35 U.S.C. § 119(a) to Japanese Patent Application No. 2016-246959, filed on Dec. 20, 2016 in the Japan Patent Office, the entire disclosure of which is hereby incorporated by reference herein.

BACKGROUND

Technical Field

Embodiments of the present disclosure relate to a photoelectric conversion device, a photoelectric conversion method, and an image forming apparatus.

Background Art

One of noise generated by a complementary metal oxide semiconductor (CMOS) image sensor is known as a random telegraph signal (RTS) noise that randomly occurs in a specific pixel. The occurrence of the RTS noise adversely produces a defective image. Such an adverse effect of the RTS noise becomes more noticeable with the development of miniaturization of the CMOS sensors.

SUMMARY

In one aspect of this disclosure, there is provided an improved photoelectric conversion device including a generation circuit and a controller. The generation circuit generates an image signal according to an intensity of light being input. The controller to control the generation circuit to generate a dark-time image signal equivalent to an image signal generated by the generation circuit without exposure to external light.

In another aspect of this disclosure there is provided an improved photoelectric conversion method including generating an image signal according to an intensity of light received by a generation circuit; and controlling the generation circuit to generate a dark-time image signal equivalent to an image signal generated by the generation circuit without exposure to external light.

In still another aspect of this disclosure there is provided an improved image forming apparatus including a document tray to place a document; a light source to emit light to the document; and a photoelectric conversion device to receive the light reflected by the document. The photoelectric conversion device includes a generation circuit and a controller. The generation circuit generates an image signal according to an intensity of the light received. The controller controls the generation circuit to generate a dark-time image signal equivalent to an image signal generated by the generation circuit without exposure to light coming from an outside of the image forming apparatus.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIG. 16A is an illustration of a timing of each operation of the photoelectric conversion element in the regular reading mode;

FIG. 16B is an illustration of a timing of each operation of the photoelectric conversion element in the pseudo light shielding mode;

Figure 1:
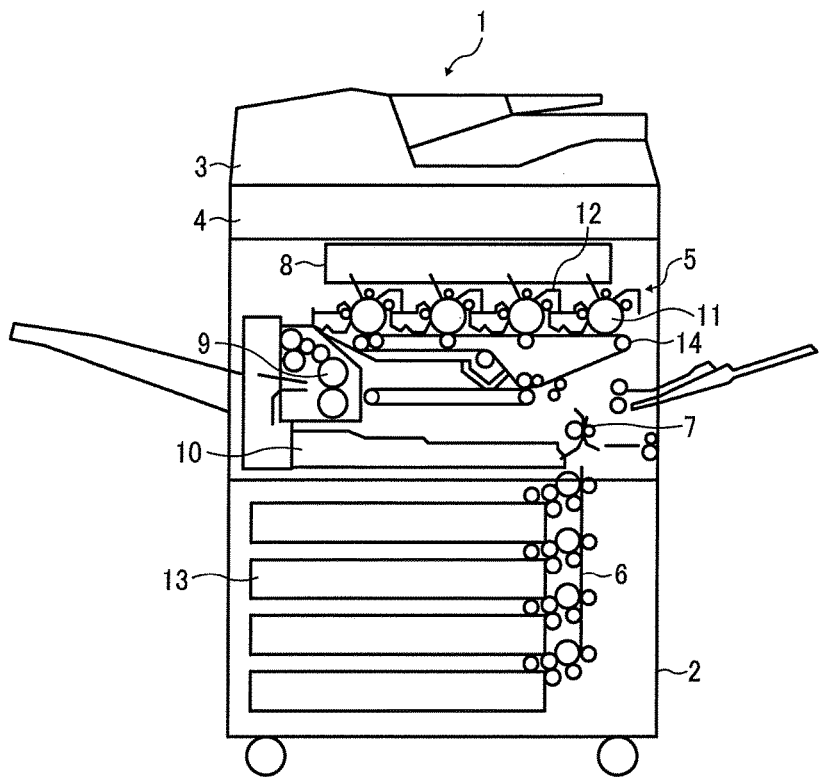
FIG. 1 is a cross-sectional side view of a multifunction peripheral (MFP) according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity.

However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

Firstly, a description is given of application fields. A photoelectric conversion device and a photoelectric conversion method according to the embodiments of the present disclosure are applicable to devices that detect light and perform predetermined information processing as well as devices that read images. More specifically, the photoelectric conversion device and the photoelectric conversion method according to the embodiments of the present disclosure are applicable to, for example, a linear sensor used in the MFPs, a linear autofocus (AF) sensor for cameras and video cameras, and a line sensor for reading characters, symbols, and figures drawn in an interactive whiteboard device (an electronic whiteboard). Hereinafter, a description is given of a multifunction peripheral (MFP) as an example, to which the photoelectric conversion device and the photoelectric conversion method according to at least one embodiment of the present disclosure are applied.

First Embodiment

Configuration of MFP

First, FIG. 1 is a cross-sectional view of the MFP according to the first embodiment of the present disclosure. FIG. 1 further illustrates the interior of a main body 2 of the MFP. As illustrated in FIG. 1, the MFP has a reading device 1 and the main body 2. The reading device 1 includes an automatic document feeder (ADF) 3 and a scanning device 4.

The main body 2 includes a tandem image forming device 5, a registration roller 7 that feeds a recording medium from a paper feeder 13 to the image forming device 5 through a conveyance path 6, an optical writing device 8, a fixing conveyance device 9, and a duplex tray 10. The image forming device 5 includes four photoconductor drums 11 arranged side by side. The four photoconductor drums 11 correspond to four colors of yellow (Y), magenta (M), cyan (C), and black (B). Around each photoconductor drum 11, image forming elements such as a charger, a development device 12, a transfer device, a cleaner, and a discharger are disposed. Further, an intermediate transfer belt 14 is stretched out between a drive roller and a driven roller stretches over a driving roller and a driven roller, such that the intermediate transfer belt 14 passes through a nip formed by the transfer device and the photoconductor drum 11.

In such a tandem image forming apparatus, the optical writing device 8 optically writes an image on the photoconductor drums 11 corresponding to the colors Y, M, C, and K, and the development device 12 develops an image with toner of each color. Thus, the photoconductor drums 11 primarily transfer the developed toner images onto the intermediate transfer belt 14 in order of the colors Y, M, C, and K. Then, the transfer device secondarily transfers a full-color image obtained by the primary transfer operation, in which the toner images of four colors are superimposed on each other, onto a recording medium. Subsequently, the fixing conveyance device fixes and discharges the recording medium. Thus, a full-color image is formed on the recording medium.

Configuration of ADF and Scanner

Figure 2:
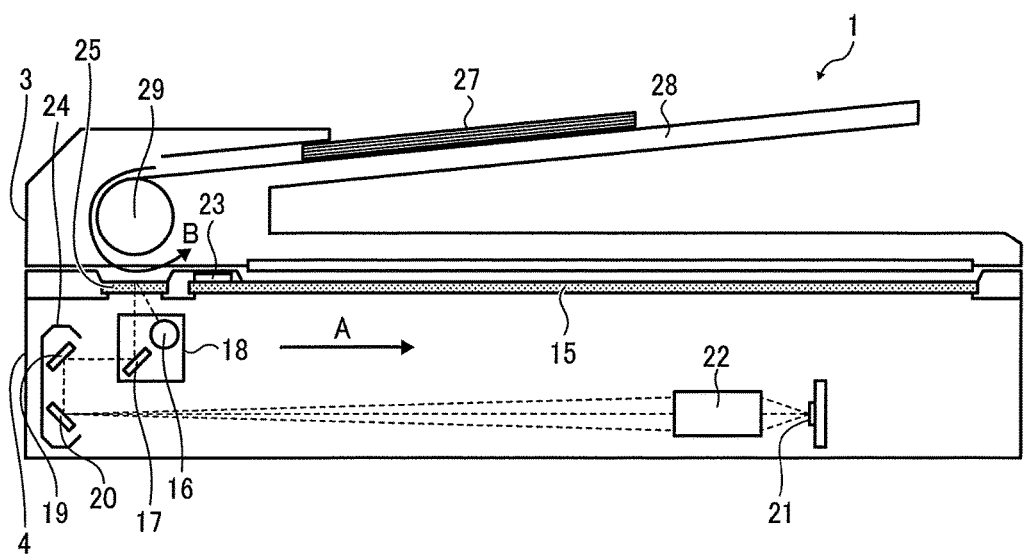
FIG. 2 is a cross-sectional side view of a reader mounted in the MFP of FIG. 1.

FIG. 2 is a cross-sectional view of the ADF 3 and the scanning device 4. The scanning device 4 includes an exposure glass 15 on which a document is placed. Further, the scanning device 4 includes a first carriage 18 and a second carriage 24. The first carriage includes a light source 16 that exposes the document and a first reflecting mirror 17. The second carriage 24 includes a second reflecting mirror 19 and a third reflecting mirror 20. The scanning device 4 also includes a lens unit 22 to form an image of light reflected from the third reflecting mirror 20 in a light-receiving area of a photoelectric conversion element 21. Further, the scanning device 4 includes a reference white board 23 to be used to correct various distortion caused by, for example, a reading optical system and a sheet-through reading slit 25. In the scanning device 4, the photoelectric conversion element 21 receives light reflected from a document illuminated with light emitted from the light source 16, and converts the received light into an electrical signal (image data), outputting the electrical signal.

The ADF 3 is connected with the main body 2 of the MFP via a hinge member so that the ADF 3 is opened and closed relative to the contact glass 15. The ADF 3 includes a document tray 28 on which a bundle of documents 27 is placed. The ADF 3 further includes a device to separate a document one by one from the bundle of documents 27 placed on the document tray 28, and automatically feeds the document to the sheet-through reading slit 25 using a feeding roller 29.

Operation of Reading Document

The above-described reading device 1 has a scan mode to read a document placed on the contact glass 15 and a sheet-through mode to read a document automatically fed by the ADF. Prior to the scan mode reading operation or sheet-through mode reading operation, the light source 16 emits light to the reference white board 23, and the photoelectric conversion element 21 reads an image according to the light reflected from the reference white board 23. Then, photoelectric conversion element 21 generates and stores shading correction data such that each pixel of the image data for one line has a uniformed level. The stored shading correction data is used for the shading correction of the image data read in the scan mode or the sheet-through mode to be described below.

In the scan mode, the first carriage 18 and the second carriage 24 are moved by a stepping motor in a direction indicated by arrow A (a sub-scanning direction) to scan the document. At this time, the second carriage 24 moves at a speed half of the speed of the first carriage 18 so as to maintain the optical path length from the contact glass 15 to the light-receiving area of the photoelectric conversion element 21 at constant length.

At the same time, the image surface that is a lower surface of the document placed on the contact glass 15 is illuminated with (exposed to) the light emitted from the light source 16 of the first carriage 18. Then, the light reflected from the image surface is sequentially reflected by the first reflecting mirror 17 of the first carriage 18, the second reflecting mirror 19, and the third reflecting mirror 20 of the second carriage 24. The light reflected by the third reflecting mirror 20 is directed to and collected by the lens unit 22, forming an image at the light-receiving area of the photoelectric conversion element 21. The photoelectric conversion element 21 photoelectrically converts the received light for each line to an electric signal to thereby generate image data. The photoelectric conversion element 21 digitalizes the generated image data, and performs gain adjustment on the image data, outputting the image data. The document is discharged to a discharge port after being read.

In the sheet-through mode, the first carriage 18 and the second carriage 24 move to a position below the sheet-through reading slit 25 and stop. Thereafter, the bundle of the documents 27 on the document tray 28 of the ADF 3 is automatically conveyed by the feeding roller 29 in a direction (the sub-scan direction) indicated by arrow B in FIG. 2, beginning from a lowermost document. The scanning device 4 scans a document passing through the position of the sheet-through reading slit 25.

At this time, the light source 16 of the first carriage 18 illuminates the lower surface (image surface) of the automatically fed document. Then, the light reflected from the image surface is sequentially reflected by the first reflecting mirror 17 of the first carriage 18, the second reflecting mirror 19, and the third reflecting mirror 20 of the second carriage 24. The light reflected by the third reflecting mirror 20 is directed to and collected by the lens unit 22, forming an image at the light-receiving area of the photoelectric conversion element 21. The photoelectric conversion element 21 photoelectrically converts the received light for each line to an electric signal to thereby generate image data. The photoelectric conversion element 21—digitalizes the generated image data, and performs gain adjustment on the image data, outputting the image data. The document is discharged to a discharge port after being read.

Hardware Configuration of MFP

Figure 3:
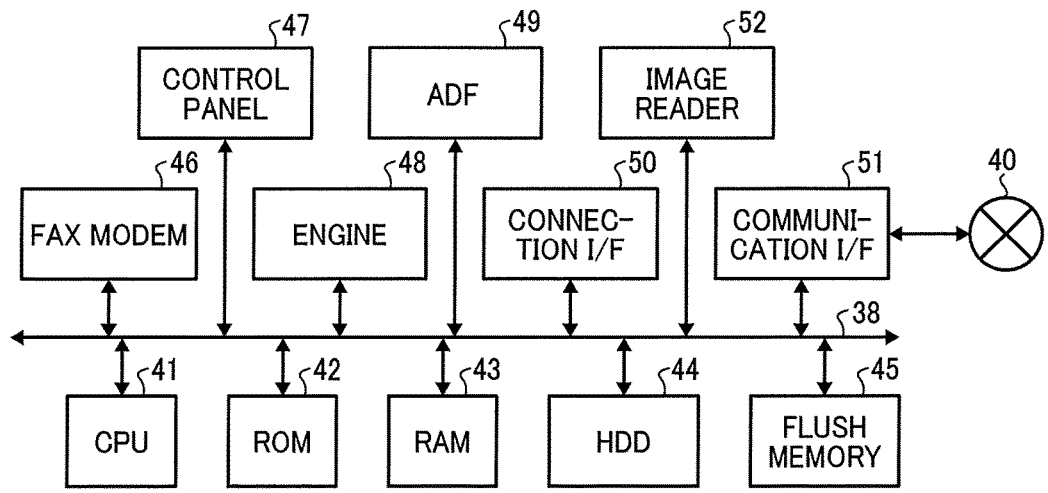
FIG. 3 is a schematic block diagram of a hardware configuration of the MFP of FIG. 1.

Next, FIG. 3 is an illustration of a hardware configuration of the MFP. As illustrated in FIG. 3, the MFP includes a control processing unit (CPU) 41, a read only memory (ROM) 42, a random access memory (RAM) 43, a hard disk drive (HDD) 44, and a flash memory 45. Further, the MFP includes a facsimile (FAX) modem 46, a control panel 47, an engine 48, an ADF 49 (corresponding to the ADF 3 in FIGS. 1 and 2), a connection interface (connection I/F) 50, an image reader 52, and a communication I/F 51 that performs wired communication or wireless communication via a network such as the Internet. The above-described components, the CPU 41 to the image reader 52, are connected to each other via a system bus 38 in FIG. 3.

The CPU 41 centrally controls the operation of the MFP. The CPU 41 controls the entire operation of the MFP by executing programs stored in, e.g., the ROM 42 or the HDD 44, using the RAM 43 as a work area, to implement various functions such as a copier function, a scanner function, a facsimile function and a printer function as described above. Further, the CPU 41 enables noise detection of the photoelectric conversion element 21 with high accuracy in a short time based on the "reading control program" stored in a memory such as the HDD 44 or the flash memory 45.

In some embodiments, the reading control program is installed for distribution in any desired computer-readable recording medium such as a compact disc, a read-only memory (CD-ROM), a flexible disk (FD), a compact disc-recordable (CD-R), and a digital versatile disk (DVD) in a file format installable or executable by a computer. Alternatively, in some other embodiments, the reading control program is installed for distribution in any desired computer-readable recording medium such as a Blu-ray disc (registered trademark) and a semiconductor memory. Alternatively, in some still other embodiments, the reading control program is provided in the form of being installed via a network such as the Internet. Alternatively, in some yet other embodiment, the reading control program is provided by being incorporated in advance in a ROM or the like in the apparatus.

The engine 48 is hardware for performing processing other than data communication and general information processing, to implement the copier function, the scanner function, or the printer function. The engine 48 includes, for example, a scanner that scans and reads a character and an image on a document or a business card and a plotter that performs printing on a sheet such as paper. The facsimile modem 46 performs a facsimile communication.

Configuration of Image Reader

Figure 4:
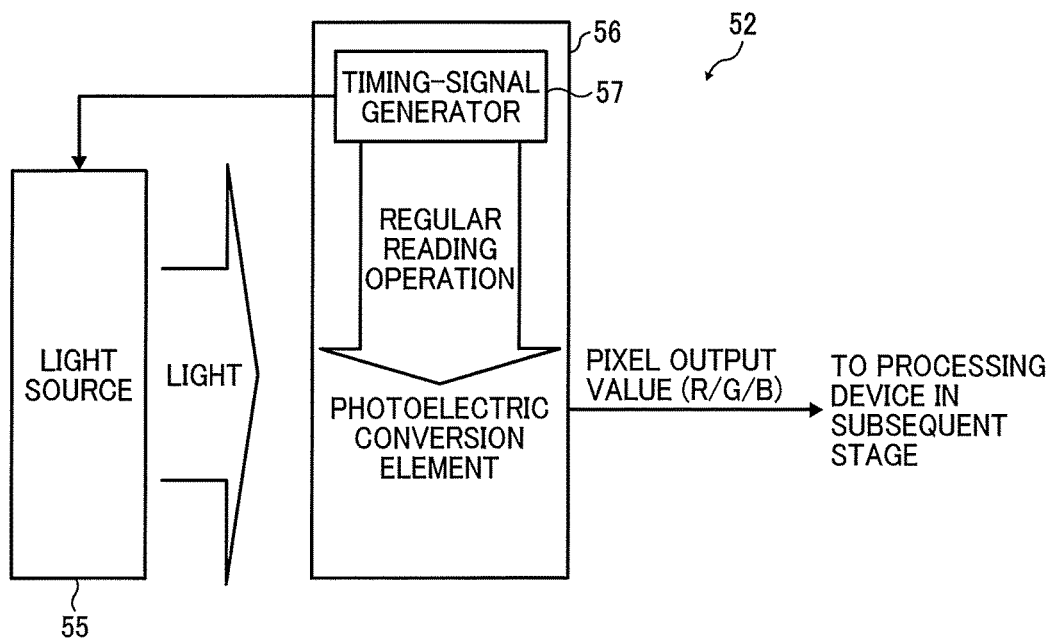
FIG. 4 is a block diagram of a photoelectric conversion element mounted in the MFP of FIG. 1.

The image reader 52 illustrated in FIG. 3 includes the first carriage 18, the photoelectric conversion element 21, the lens unit 22, and the second carriage 24 in FIG. 2. FIG. 4 is a schematic diagram of the configuration of the image reader 52. In the image reader 52 as illustrated in FIG. 4, a light source 55 (the light source 16) illuminates a document on the document tray 28 with light, and a photoelectric conversion element 56 (the photoelectric conversion element 21), which is an example of a generator, receives the light reflected by the document. The photoelectric conversion element 56 is a linear sensor in which pixels are unidimensionally arranged in a main-scan direction.

The photoelectric conversion element 56 has, for example, a channel for each color of red, green, and blue (R, G, B) of three primary colors of light, thereby to generate image signals for the colors RBG according to the amount of received light, outputting the image signals to the subsequent processing device. The photoelectric conversion element 56 includes a timing-signal generator 57, which is an example of a controller, to generate a timing signal for controlling image reading, and an assert signal and a negate signal with respect to the light source 55.

Note that the subsequent processing device is incorporated in the photoelectric conversion element 56. Alternatively, the subsequent processing device is disposed outside the photoelectric conversion element 56. Further, the timing-signal generator 57 is incorporated in the photoelectric conversion element 56. Alternatively, in some embodiments, the timing-signal generator 57 is disposed outside the photoelectric conversion element 56.

Configuration of Photoelectric Conversion Element

Figure 5:
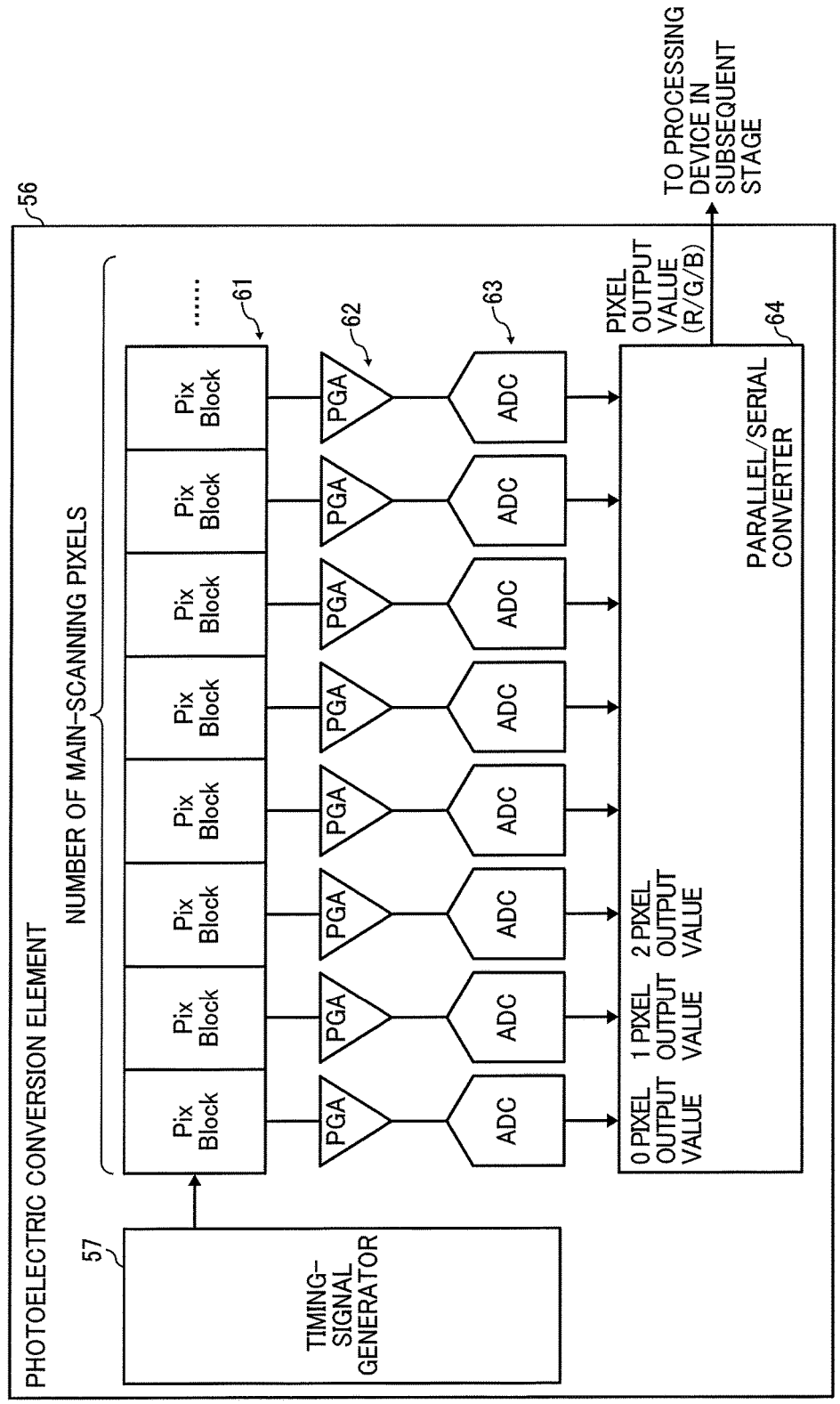
FIG. 5 is another block diagram of the photoelectric conversion element mounted in the MFP of FIG. 1.

FIG. 5 is a detailed block diagram of the photoelectric conversion element 56 of FIG. 4. As illustrated in FIG. 5, the photoelectric conversion element 56 includes the timing-signal generator 57, a pixel-signal generation circuit 61, an amplifier (programmable gain amplifier (PGA)) 62, and an analog-digital converter (ADC) 63. In the pixel-signal generation circuit 61, pixels are unidimensionally arranged. The PGA 62 amplifies each image signal with a predetermined gain. The ADC 63 digitalizes an image signal output from each PGA 62. The pixel-signal generation circuit 61, the PGA 62, and the ADC 63 are provided for each color channel of RGB. In the present embodiment, the main-scan direction is the direction in which the pixels are unidimensionally arranged, and the sub-scan direction is a direction two-dimensionally perpendicular to the main-scan direction.

The photoelectric conversion element 56 further includes a parallel/serial converter 64 that converts the image signal supplied in parallel from the ADC 63 of each channel of RGB into a serial image signal, transmitting the serial image signal to the subsequent processing device. The output timing of the pixel-signal generation circuit 61 through output timing of the pixel-signal generation circuit 61, the PGA 62, the ADC 63, and the parallel/serial converter 64 are controlled by clock signals from the timing-signal generator 57.

Circuit Configuration of Pixel-Signal Generation Circuit

Figure 6:
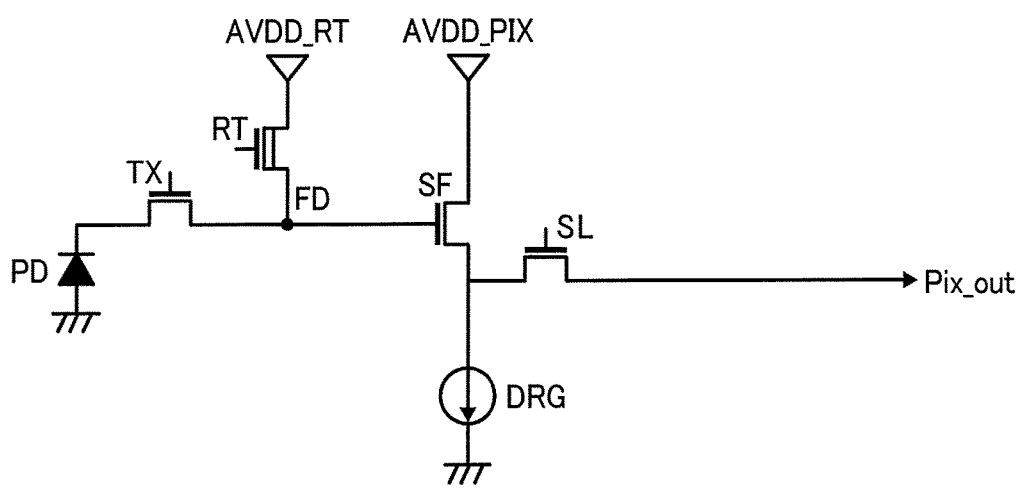
FIG. 6 is a circuit diagram of the photoelectric conversion element mounted in the MFP of FIG. 1.

FIG. 6 is a circuit diagram of each pixel of the pixel-signal generation circuit 61. Referring to FIG. 6, each pixel of the pixel-signal generation circuit 61 includes a photodiode PD as a photosensor and a floating diffusion FD that converts charges accumulated according to the amount of received light into a voltage. Each pixel of the pixel-signal generation circuit 61 includes a charge-transfer switch TX and a reset switch RT. The charge-transfer switch TX is to transfer charge accumulated in the photodiode PD to the floating diffusion FD. The reset switch RT is to reset the electrical potential in the floating diffusion FD to a rest electrical potential AVDD_RT. The pixel-signal generation circuit 61 for each pixel further includes a source follower SF and a switch SL. The source follower SF is disposed between a source voltage AVDD_PIX and a current source DRG of the source follower SF. The switch SL is to transfer the image signal (Pix_out) subjected to voltage conversion to the subsequent PGA 62.

The photoelectric conversion element 56 has, for example, a column structure in which a set of nine pixels (3 horizontal pixels×9 vertical pixels) as one driving pixel unit is input to common PGA 62 and ADC 63. In some embodiment, the photoelectric conversion element 56 having the column structure includes an analog memory at a subsequent stage of the switch SL to accumulate charges as well.

Regular Reading Mode

Figure 7:
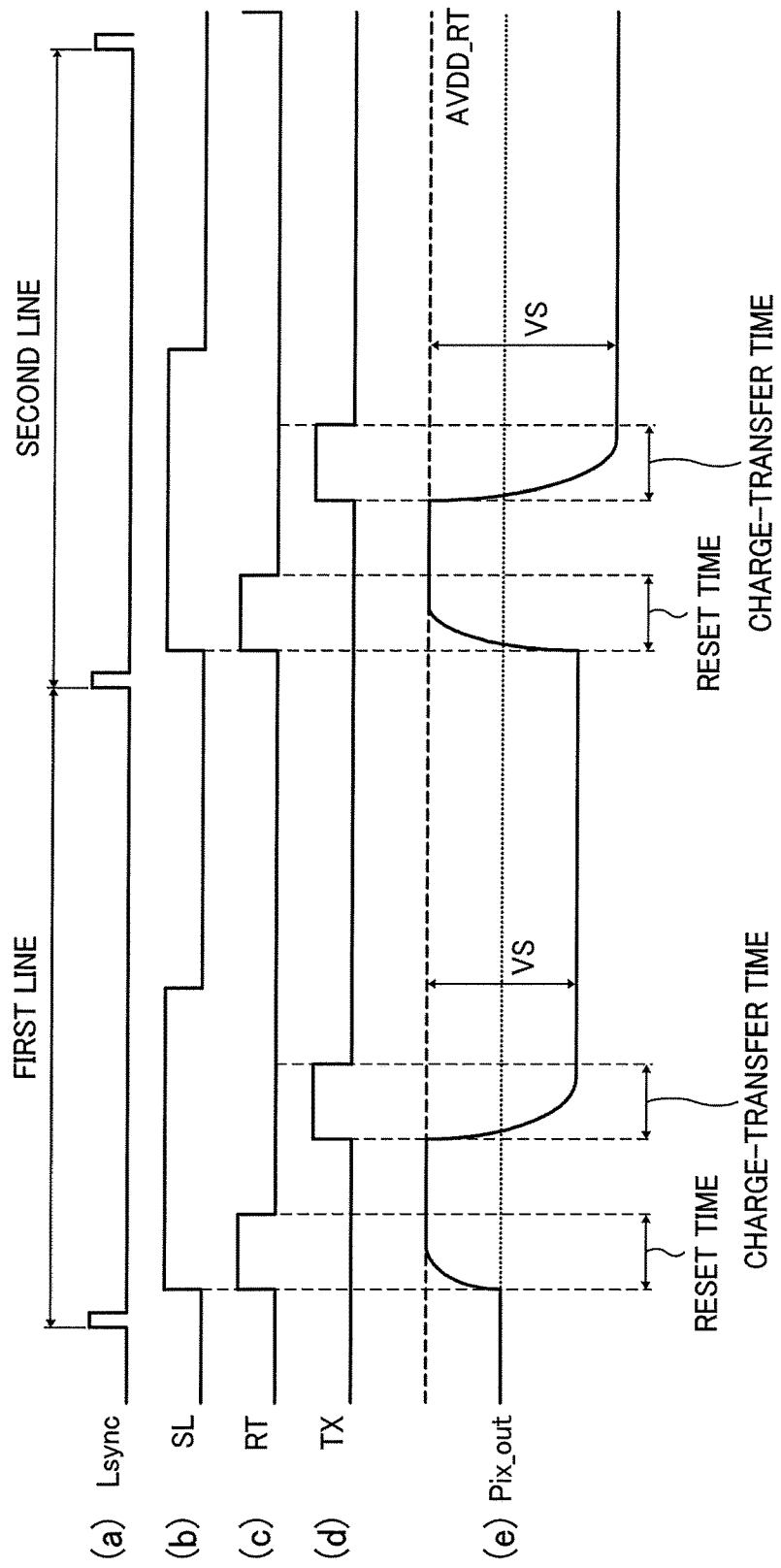
FIG. 7 is a timing chart of a signal waveform of the photoelectric conversion element of FIG. 5 in a regular reading mode of the MFP of FIG. 1.

FIG. 7 is a timing chart of a regular reading operation of the photoelectric conversion element 56 in a regular reading mode. FIG. 7(a) is a timing chart of a line synchronous signal (Lsync) that is one-line synchronous signal. FIG. 7(b) is a timing chart of a switch control signal (SL) to on-off control the switch SL to transfer the image signal (Pix_out) subjected to the voltage conversion to the subsequent PGA 62. FIG. 7(c) is a timing chart of the reset signal (RT) to on-off control the reset switch RT to reset the electrical potential of the floating diffusion FD to a reset electrical potential AVDD_RT. FIG. 7(d) is a timing chart of a transfer control signal (TX) to on-off control the charge-transfer switch TX to transfer charges accumulated in the photodiode PD to the floating diffusion FD. FIG. 7(e) illustrates the timing and level of the image signal (Pix_out) output from the pixel-signal generation circuit 61 for a pixel.

The timing-signal generator 57 generates a switch control signal (SL), a reset signal (RT) and a transfer control signal (TX) based on the timing of the line synchronous signal (Lsync).

As illustrated in FIG. 7(a), there is one-line synchronous time period between a first line synchronous signal (Lsync) at a high level and a second (subsequent) line synchronous signal (Lsync) at a high level. In response to the generation of a line synchronous signal (Lsync) at high level, the timing-signal generator 57 asserts a switch control signal (S1) that maintains at high level for a time period that is equal to approximately first half of the one-line synchronous time period. In addition, the timing-signal generator 57 asserts a reset signal (RT) at the timing of asserting of the switch control signal (SL). Upon asserting the reset signal (RT), the pixel-signal generation circuit 61 transfers, as an image signal (analog output Pix_out) that is AVDD_RT, a reset electrical potential AVDD_RT that has passed through the floating diffusion FD and the source follower SF, to a subsequent PGA 62. The above describes the reset time period illustrated in FIG. 7(e).

Referring to FIG. 7(c), after the reset signal (RT) is negated, the transfer control signal (TX) is asserted as illustrated in FIG. 7(d). When the transfer control signal (TX) is asserted, the charges accumulated in the floating diffusion FD is transferred as the analog output Pix_out during the charge-transfer time in FIG. 7(e). A voltage VS in FIG. 7(e) that is the analog output Pix_out becomes a negative polarity signal. The pixel-signal generation circuit 61 outputs an image signal in a reading level corresponding to the charges accumulated in the photodiode PD for one line scan.

After transferring the analog output Pix_out during the charge-transfer time, the timing-signal generator 57 negates the switch control signal (SL) during the latter (second) half of one-line synchronization time period. The transferred image signal, which is the analog output Pix_out, is digitized through the operations of the PGA 62, the ADC 63 and the parallel/serial converter 64 in FIG. 5, and transferred to, for example, a processing device, such as a noise detector, at a subsequent stage.

RTS Noise

Figure 8:
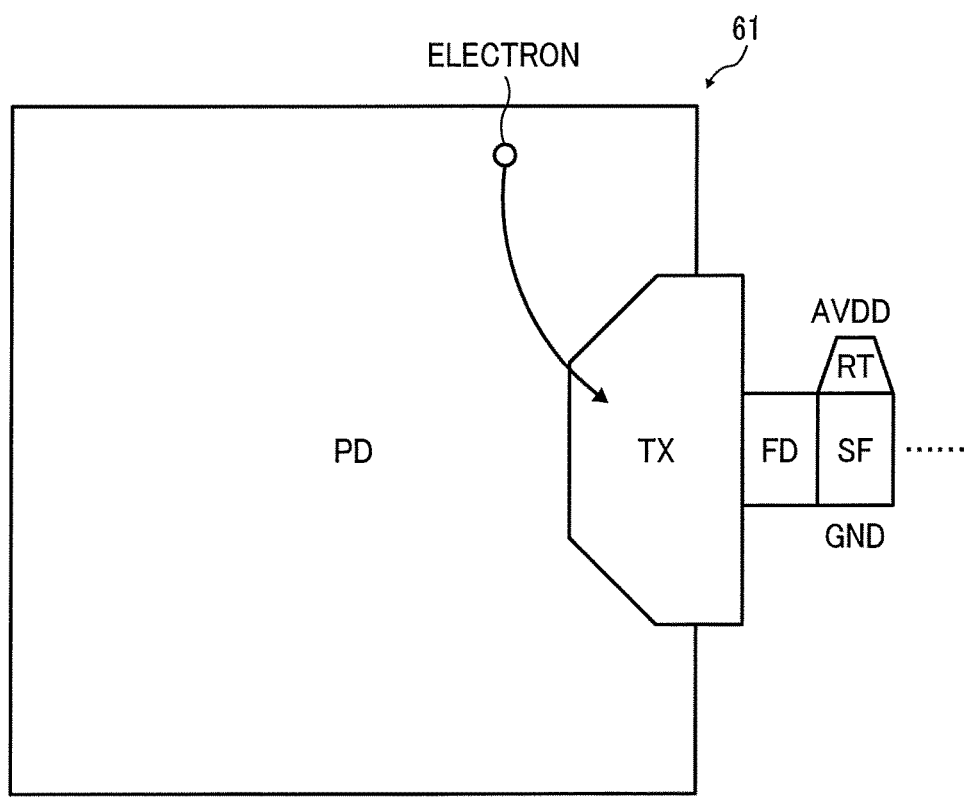
FIG. 8 is an illustration of a configuration of each pixel of the photoelectric conversion element of FIG. 5 and a position to generate RTS noise.

FIG. 8 is a circuit layout of a part of the pixel-signal generation circuit 61 corresponding to one pixel. As illustrated in FIG. 8, one pixel of the pixel-signal generation circuit 61 includes the photodiode PD and the charge-transfer switch TX for transferring charges to the floating diffusion FD. In addition, one pixel of the pixel-signal generation circuit 61 includes the floating diffusion FD that converts the accumulated charges into a voltage according to the amount of light received by the photodiode PD. In addition, one pixel of the pixel-signal generation circuit 61 includes the reset switch RT that resets the potentials of the source follower SF and the floating diffusion FD to a reset potential AVDD_RT.

When such a photoelectric conversion element 56 is produced as a CMOS image sensor, random telegraph signal noise (RTS noise) might arise. The RTS noise is the phenomenon that the fluctuations in signal output level occurs because one of electrons moving in the channel of the metal oxide semiconductor (MOS) transistor is captured due to the trap level in, e.g., the gate insulator film. For this reason, the RTS noise occurs as an output fluctuation after the source follower SF (see FIGS. 4 and 8) made of MOS transistors. The RTS noise does not occur at the output end of the photodiode PD at the preceding stage of the source follower SF.

In recent years, the source follower SF is designed to be extremely small in size with an increase in sensitivity of sensors (reduction in capacity of the floating diffusion FD). For this reason, the above-described capture of electrons is more likely to occur, and thereby the RTS noise more obviously occurs. Note that the RTS noise occurs at random timing according to temperature change, manufacturing process variation in CMOS, circuit configuration, or other conditions.

Figure 9:
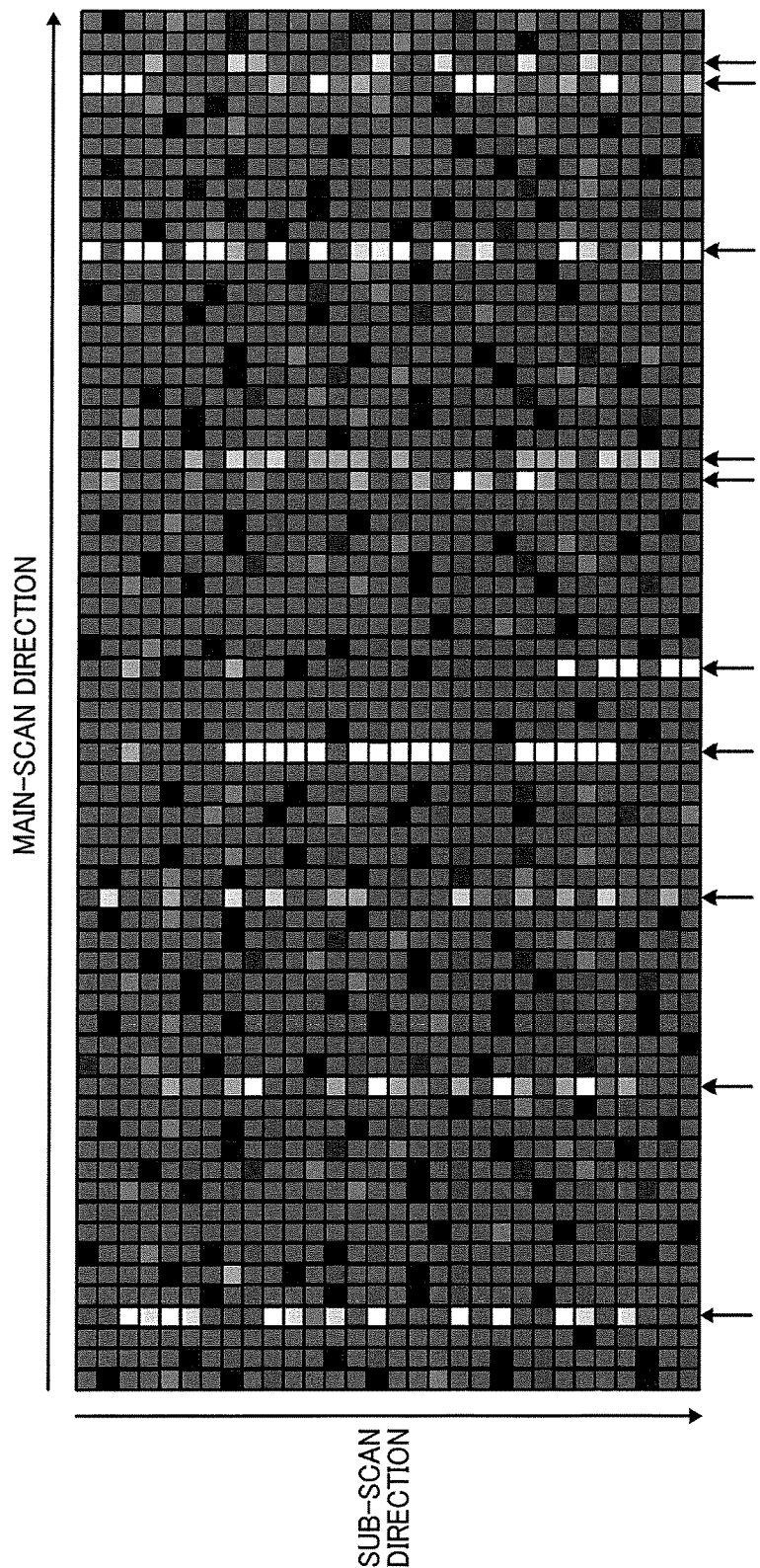
FIG. 9 is an illustration of an example of an image representing defective pixels due to RTS noise.

FIG. 9 is an illustration of an example of a defective image generated when the RTS noise occurs in a linear sensor. In the case of a liner sensor used in, e.g., cameras, a defective image due to the RTS noise represents a dot pattern that dots for the respective pixels are discretely distributed, which is not conspicuous. However, in the case of a linear sensor used in, e.g., a scan device, when RTS noise occurs, a defective image due to the RTS noise represents changes in pixel level along a vertical line as illustrated in FIG. 9 when an image having a uniform in pixel level as a whole or an image captured without exposure to light coming from the outside of the MFP, which is hereinafter referred to as dark-time image) is obtained. Thus, linear streaks disadvantageously appear in one image.

Figure 10:
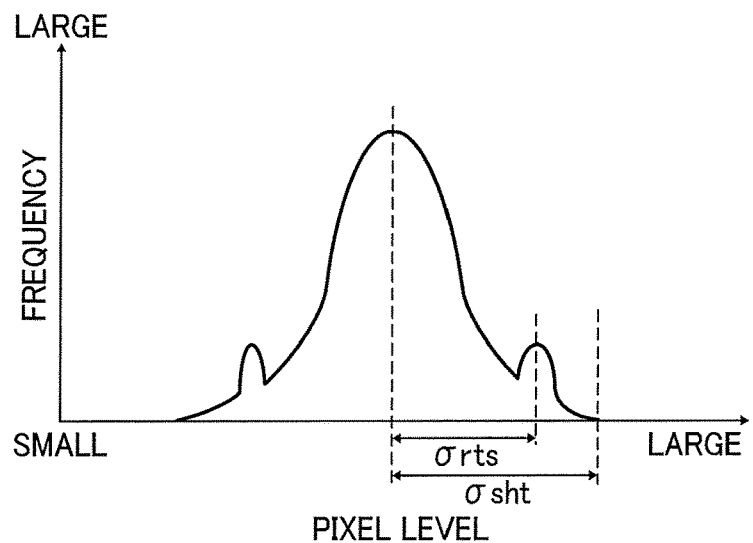
FIG. 10 is a graph of a frequency of a pixel level of a pixel having a great RTS noise when an ADF is closed.

FIG. 10 is a graph of a frequency of a pixel level with a large RTS noise when the ADF 3 of the MFP is closed. In this case, small peaks of the distribution appear at pixel levels in the positive and negative directions from the average value of the pixel values. The pixel levels differ from the average value by a certain amount, respectively. The appearance of the small peaks is caused by the RTS noise. As the amount of noise (σ rts) increases, the above-described certain amount increases.

Figure 11:
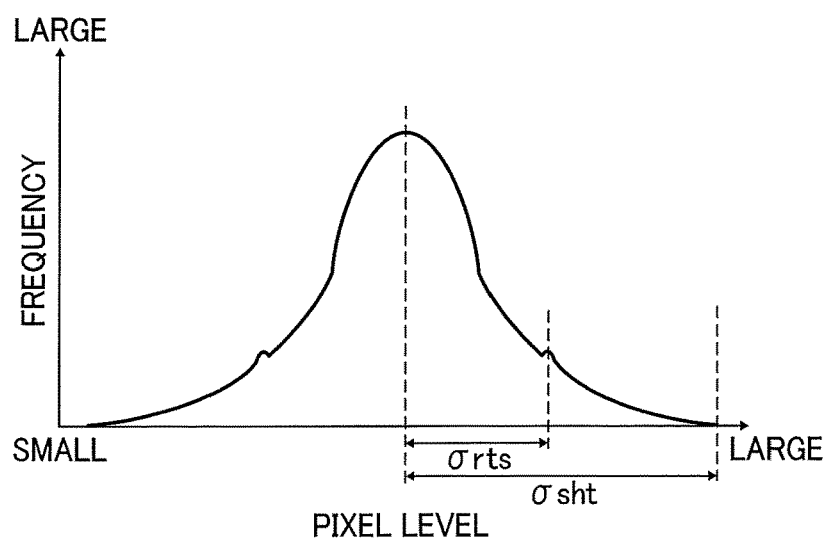
FIG. 11 is a graph of a frequency of a pixel level of a pixel having a great RTS noise when the ADF is open.

FIG. 11 is a graph of a frequency of a pixel level with a large RTS noise when the ADF 3 of the MFP is open. As is apparent from the comparison between FIG. 10 and FIG. 11, the noise amount (σ rts) is inconspicuous when the ADF 3 is open. This is because the RTS noise in FIG. 11, which causes a defective pixel, occurs due to the electrical factors within an image sensor, and the RTS noise in FIG. 11 is buried by shot noise when a surrounding pixel reaches a specific level or greater. The central value of the distribution in FIG. 10 is smaller than that of FIG. 11. This is because, when the ADF 3 is open, the pixel level increases due to external light.

If the photoelectric conversion element 56 is exposed to external light (fails to be shielded from light) for example because the ADF 3 is open, a shot noise ratio increases due to external light, which hampers obtaining accurate dark-time data (data obtained without exposure to light coming from the outside of the MPF, which is hereinafter referred to as external light), thus failing to extract only the RTS noise. Further, the defective condition of a defective image remarkably decreases due to the reduction in accuracy of noise detection and interpolation of defective pixels.

The RTS noise occurs in a random timing. To increase the accuracy of correction of noise, preferably, the noise detection is frequently performed. For example, when the ADF 3 continuously reads documents while automatically feeding the documents, a noise detection is preferably performed before reading a first document and also performed in each operation of reading a document, which enables performing interpolation processing on the RTS noise that randomly arises.

Figure 12:
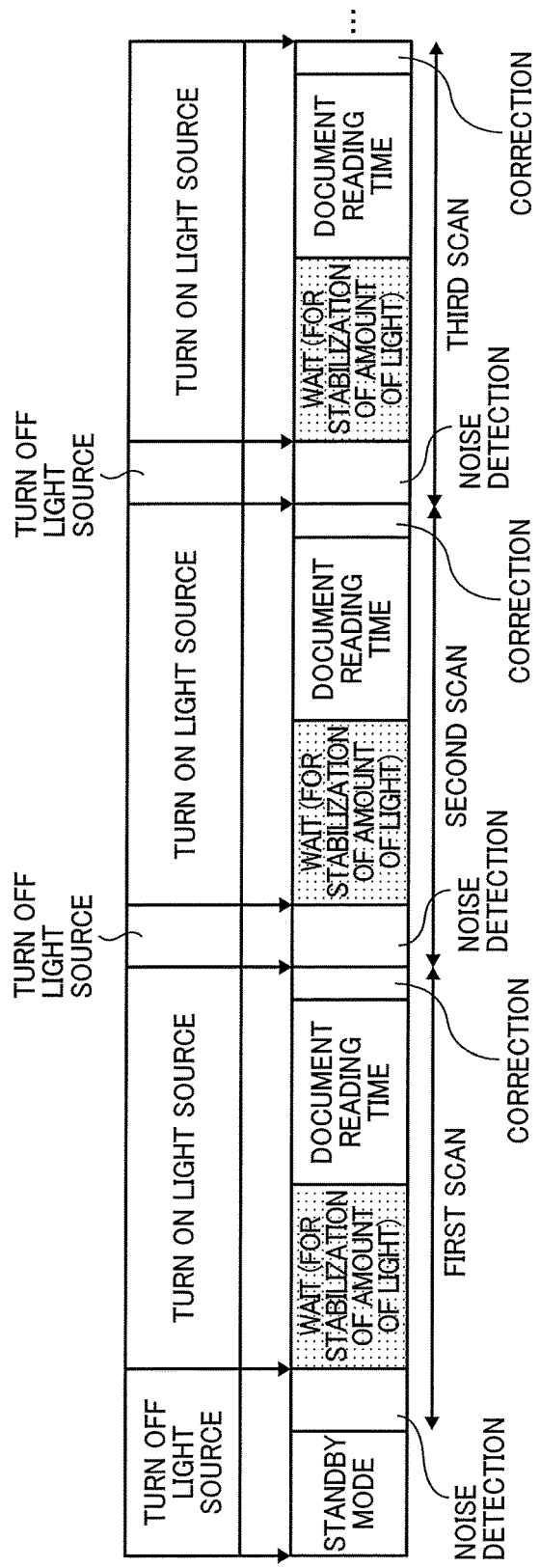
FIG. 12 is an illustration of a noise detection operation involving turning off a light source for each operation of reading a document according to a comparative example.

To maintain the accuracy of noise detection, the above-described dark-time data that is obtained with light blocked out is preferably obtained. In this case, the light source 55 is turned off once to detect noise in each operation of reading a document as illustrated in FIG. 12. This enables a timely noise detection.

However, if the light source 55 is turned off once, a waiting time arises to wait until the light source 55 gets ready for providing a stable output to turn on the light source 55 again. This significantly lowers productivity (the reading speed), which is disadvantageous. As described above, the increase in accuracy of noise detection has a trade-off relation with the reduction in time to detect noise.

First Embodiment

Figure 13:
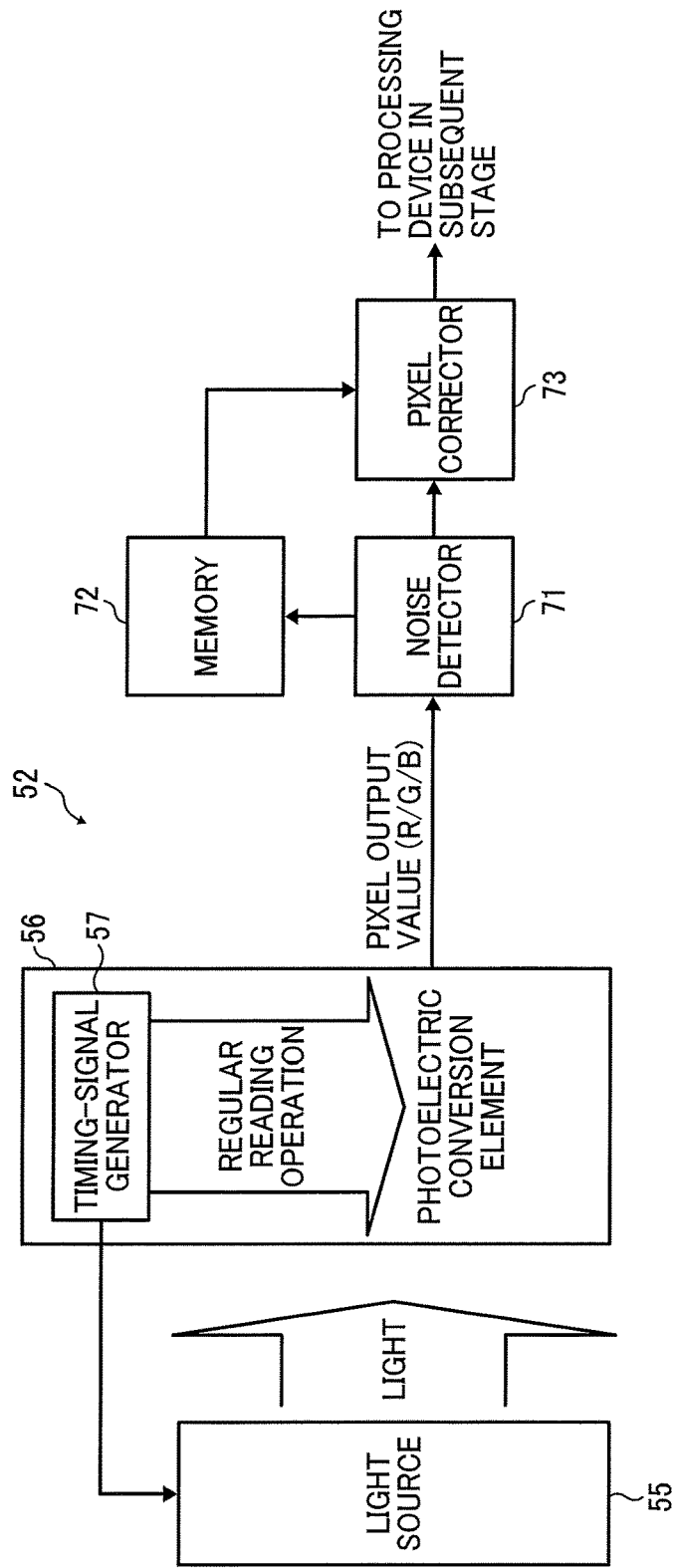
FIG. 13 is a block diagram of a part of another configuration of the MFP of FIG. 1.

The MFP according to the first embodiment includes a noise detector 71, a memory 72, and a pixel corrector 73 disposed at the subsequent stage of the photoelectric conversion element 56 as illustrated in FIG. 13. The noise detector 71 detects a physical address of a pixel (the pixel-signal generation circuit 61 for a pixel) that generates noise in the photoelectric conversion element 56. The memory 72 stores address data regarding the pixel from which noise has been detected. The pixel corrector 73 performs correction processing on the pixel from which the noise has been detected.

Figure 14:
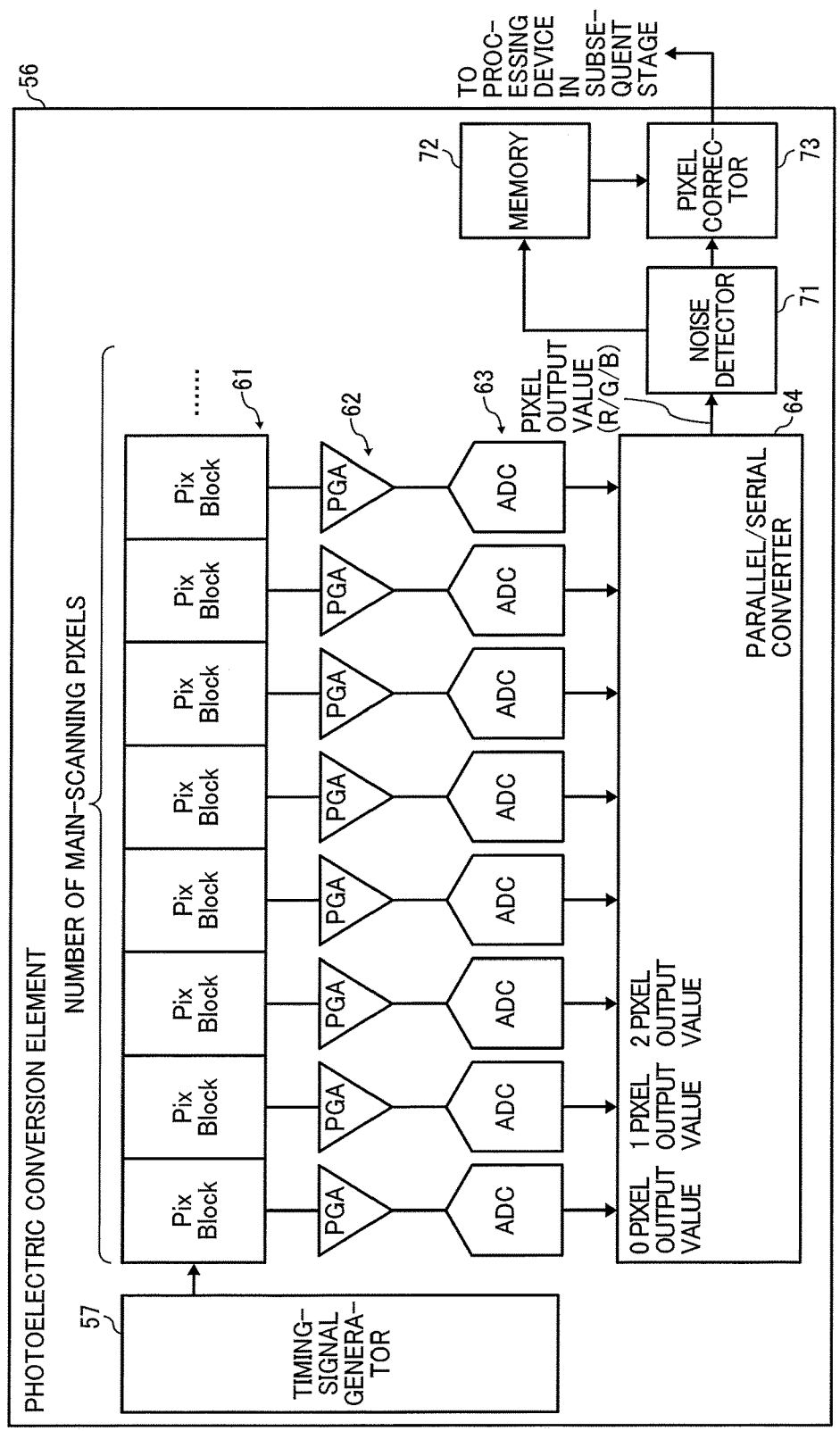
FIG. 14 is another block diagram of the part of another configuration of the MFP of FIG. 1.

Note that some or all of the photoelectric conversion element 56, the noise detector 71, the memory 72, and the pixel corrector 73 are integrated as a single circuit. In the example of FIG. 13, the photoelectric conversion element 56, the noise detector 71, the memory 72, and the pixel corrector 73 are sealed in a package to be apparently a large-scale integration circuit (LSI), that is, formed as a multi-chip. By contrast, FIG. 14 is a block diagram of an integrated circuit (IC) chip to which the photoelectric conversion element 56, the noise detector 71, the memory 72, and the pixel corrector 73 are integrated. However, the configuration illustrated in FIG. 14 is one example, and the present disclosure is not limited to this. Alternatively, in some embodiments, the photoelectric conversion element 56, the noise detector 71, and the memory 72 are integrated as an IC chip, and the pixel corrector 73 is disposed as another circuit outside the IC chip. Any combination of the photoelectric conversion element 56, the noise detector 71, and the memory 72 are integrated as an IC chip or formed as a multi-chip.

Pseudo Light Shielding Mode

The MFP according to the first embodiment performs a reading operation in a pseudo light shielding mode, in addition to the above-described regular reading mode. In the pseudo light shielding mode, the MFP is capable of obtaining an image signal that is equivalent to the image signal of dark-time data (having a dark-time level) obtained with light shielded, even when the ADF 3 is open so that the photoelectric conversion element 56 is exposed to light coming from the outside of the MPF. Note that, in some embodiments, the CPU 41 controls the reading mode between the regular reading mode and the pseudo light shielding mode. Alternatively, in some other embodiments, a dedicated circuit is disposed for each mode.

Figure 15:
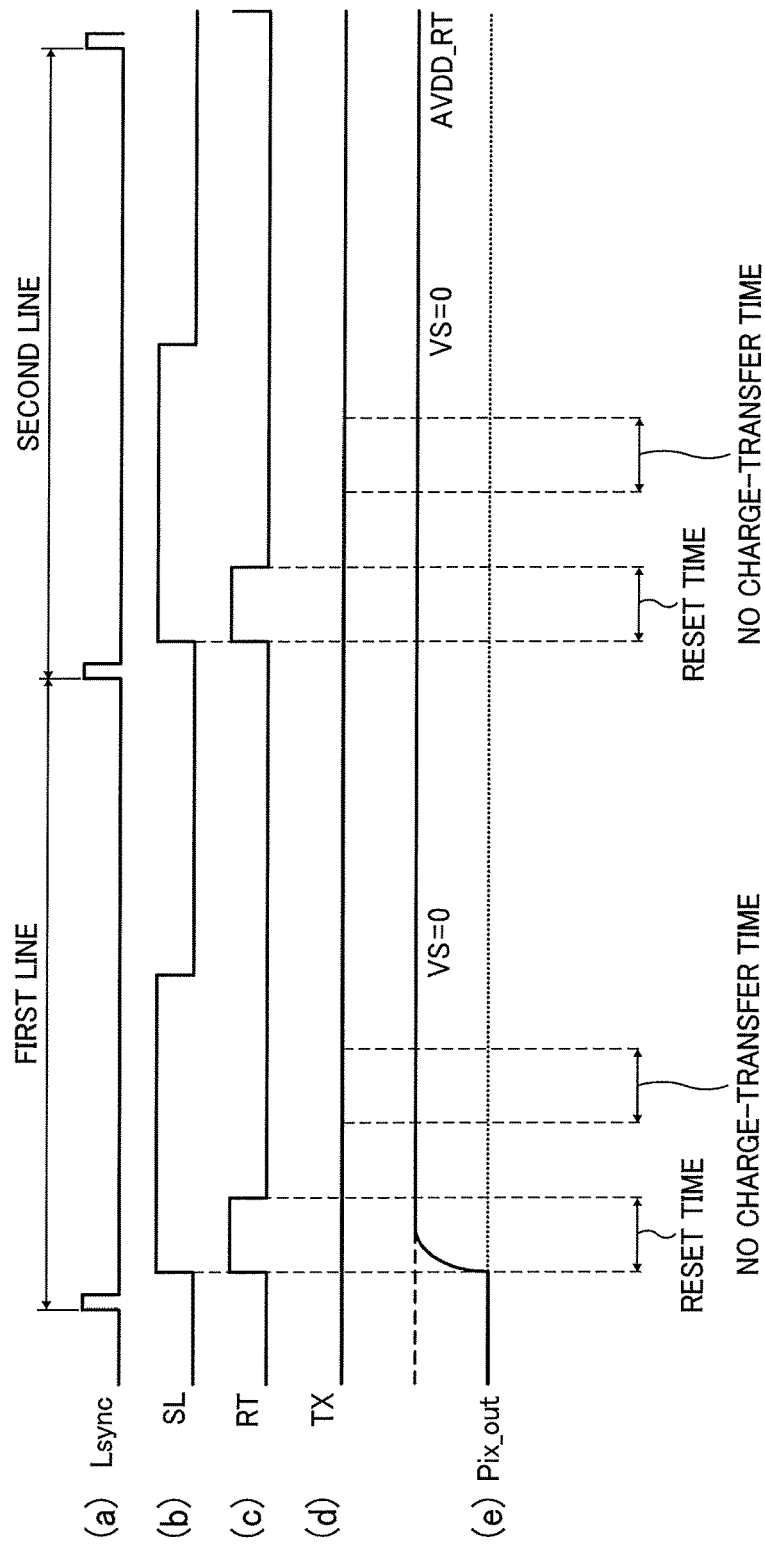
FIG. 15 is a timing chart of a signal waveform of the photoelectric conversion element of FIG. 5 in a pseudo light shielding mode of the MFP of FIG. 1.

FIG. 15 illustrates timing charts of signals of the components (see FIG. 6) of the photoelectric conversion element 56 in the pseudo light shielding mode. Same as FIG. 7, FIG. 15(a) is a timing chart of a line synchronous signal (Lsync) for one line. FIG. 15(b) is a timing chart of a switch control signal (SL) to on-off control the switch SL. FIG. 15(c) is a timing chart of a reset signal (RT) to on-off control the reset switch RT to reset the electrical potential in the floating diffusion FD to a rest electrical potential AVDD_RT. FIG. 15(d) is a timing chart of a transfer control signal (TX) to on-off control the charge-transfer switch TX to transfer charges accumulated in the photodiode PD to the floating diffusion FD. FIG. 15(e) is an illustration of the timing and level of the image signal (Pix_out) output from the pixel-signal generation circuit 61 for a pixel.

In the pseudo light shielding mode, the timing-signal generator 57 does not assert a transfer control signal (TX) after negating the reset signal (RT), which is clear from the comparison between the regular reading mode in FIG. 7 and the pseudo light shielding mode in FIG. 15. As illustrated in FIG. 15(e), the pixel-signal generation circuit 61 outputs the reset potential (VS=0) as is even during the charge-transfer time.

As described above referring to FIG. 7, upon asserting the transfer control signal (TX) by the timing-signal generator 57, the charges accumulated in the photodiode PD are transferred forward and an analog output Pix_out (a voltage VS), which is a negative-polarity signal, according to the charges transferred from the photodiode PD is output. However, without asserting the transfer control signal (TX), the charges in the photodiode PD is not transferred forward.

As described above referring to FIG. 8, RTS noise is the phenomenon that the fluctuations in signal output level occur because one of electrons moving in the channel of the metal oxide semiconductor (MOS) transistor is captured due to the trap level in, e.g., the gate insulator film. That is, RTS noise occurs as the fluctuations in output level at a stage subsequent of the source follower FS that is the MOS transistor, and does not occur at the output end of the photodiode PD at a stage previous to the source follower SF. As RTS noise does not occur at the photodiode PD, a reset electrical potential that is obtained when the transfer control signal (TX) is not asserted does not include RTS noise. Accordingly, the timing-signal generator 57 does not assert the transfer control signal (TX) after negating the reset signal (RT), thereby allowing the pixel-signal generation circuit 61 to provide an image signal (a dark-time image signal) that includes RTS noise having occurred with light shielded (without exposure to external light) (see FIG. 10).

The noise detector 71 illustrated in FIG. 13 detects a defective pixel (any pixel-signal generation circuit 61 that causes RTS noise), which causes RTS noise, based on a dark-time image signal (noise detection). Subsequently, the memory 72 stores therein address data representing a physical address of the detected defective pixel in the photoelectric conversion element 56. The pixel corrector 73 performs pixel correction processing on the defective pixel represented by the address data stored in the memory 72, so as to adjust the image signal level of the defective pixel to a regular value, thus outputting the corrected image signal.

Such a pseudo light shielding mode enables detecting and correcting a defective pixel, which causes RTS noise, based on a dark-time image signal even when the ADF 3 is open and the photoelectric conversion element 56 is exposed to external light. This configuration enables detecting noise with high accuracy.

FIG. 16A is an illustration of an operation of the photoelectric conversion element 56 in the regular reading mode. FIG. 16B is an illustration of an operation of the photoelectric conversion element 56 in the pseudo light shielding mode. In the regular reading mode, the photoelectric conversion element 56 detects noise with the light source 55 turned off for each scan as illustrated in FIG. 16A. In the pseudo light shielding mode, the photoelectric conversion element 56 detects a defective pixel, which causes RTS noise, based on the dark-time image signal obtained with the light source 55 turned on, when a scan starts once as illustrated in FIG. 16B. As is clear from FIGS. 16A and 16B, the configuration of the pseudo light shield mode eliminates the operation of turning off the light source 55 for each scan, thereby eliminating the waiting time to wait unit the light source 55 is ready to provide a stable output, thus reducing the time taken to scan all of the document. In other words, this configuration achieves a reduction in time taken (speed up) to read documents. This configuration further eliminates the use of a mechanical device such as a light shield to block out light, thereby simplifying the configuration of the MTP and achieving low cost.

Second Embodiment

Next, a description is given of a MFP according to the second embodiment. The above-described pseudo light shielding mode is a mode to output a reset electrical potential and obtain data (dark-time image signal) that is equivalent to the image signal of dark-time data obtained with light shielded. The MFP according to the second embodiment obtains such a dark-time image signal in the following manner.

Figure 17:
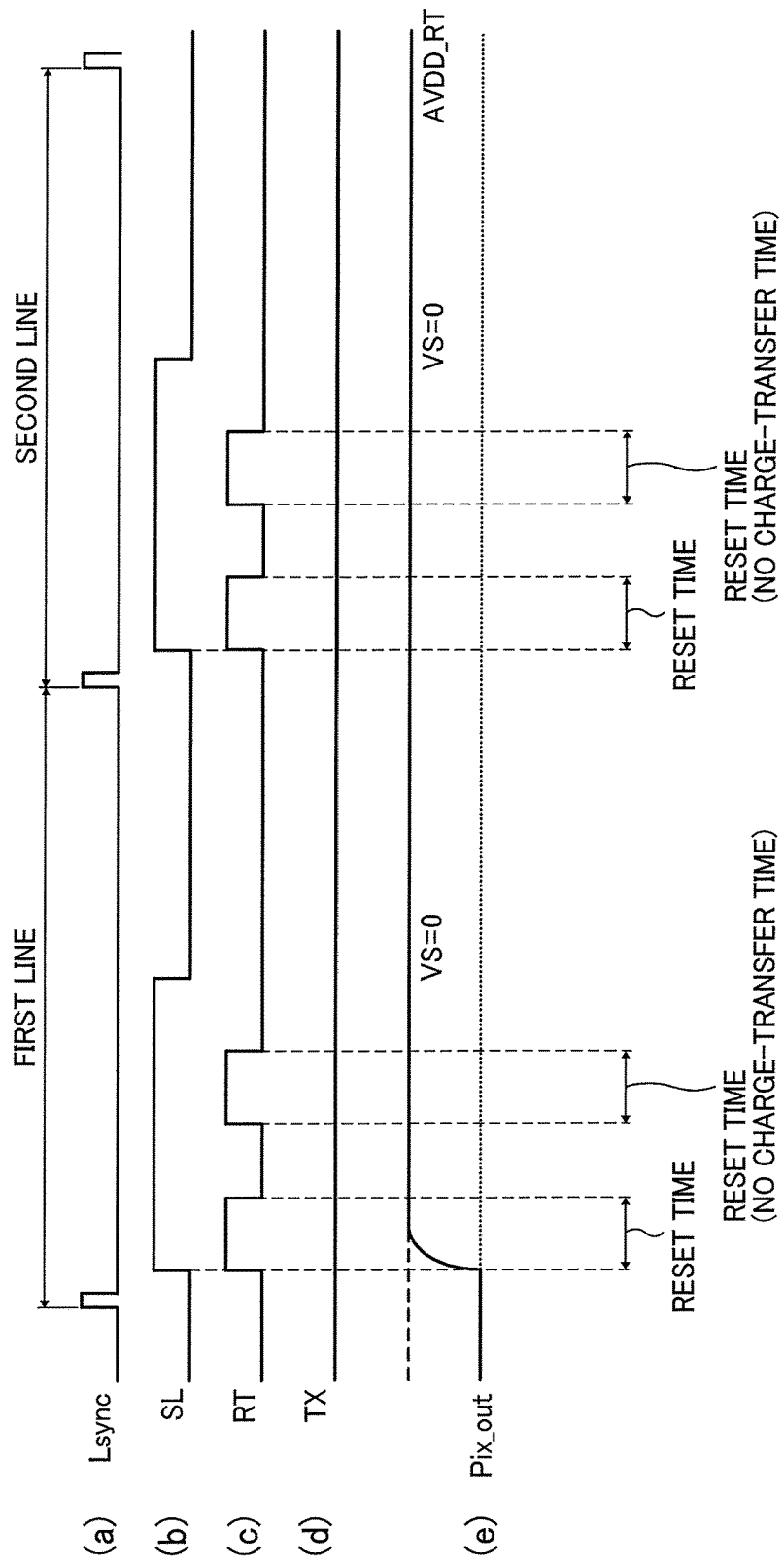
FIG. 17 is a timing chart of a signal of the photoelectric conversion element of FIG. 5 in the pseudo light shielding mode of a MFP according to a second embodiment.

FIG. 17 illustrates timing charts of signals of the components (see FIG. 6) of the photoelectric conversion element 56 in the MFP according to the second embodiment in the pseudo light shielding mode. Same as FIG. 15, FIG. 17(a) is a timing chart of a line synchronous signal (Lsync) for one line. FIG. 17(b) is a timing chart of a switch control signal (SL) to on-off control the switch SL. FIG. 17(c) is a timing chart of a reset signal (RT) to on-off control the reset switch RT to reset the electrical potential in the floating diffusion FD to a rest electrical potential AVDD_RT. FIG. 17(d) is a timing chart of a transfer control signal (TX) to on-off control the charge-transfer switch TX to transfer charges accumulated in the photodiode PD to the floating diffusion FD. FIG. 17(e) is an illustration of the timing and level of the image signal (Pix_out) output from the pixel-signal generation circuit 61 for a pixel.

In the MFP according to the second embodiment in the pseudo light shielding mode, the timing-signal generator 57 of the photoelectric conversion element 56 asserts a first reset signal (RT), and asserts a second reset signal (RT) during the charge-transfer time in the regular reading mode. Such a configuration enables restoring the image signal (dark-time image signal) to a second reset electrical potential to transfer the restored image signal to the subsequent circuit even when the image signal (Pix_out) fluctuates after the assertion of the first reset signal (RT). This configuration enables obtaining a dark-time image signal (corresponding to an image signal obtained without exposure to external light) with accuracy, and further exhibits the same advantageous effects as those of the above-described embodiment.

In the present embodiment, the timing-signal generator 57 of the photoelectric conversion element 56 asserts the reset signal (RT) twice during the assertion of the switch control signal (SL). However, no limitation is intended herein. Alternatively, in some embodiments, the timing-signal generator 57 asserts the reset signal (RT) three times or more during the assertion of the switch control signal (SL). The second embodiment differs from the first embodiment in such a point. The same description and advantageous effects apply to the second embodiment as those of the first embodiment as described above, except for the assertion of the resent signal for twice or more.

Third Embodiment

Figure 18:
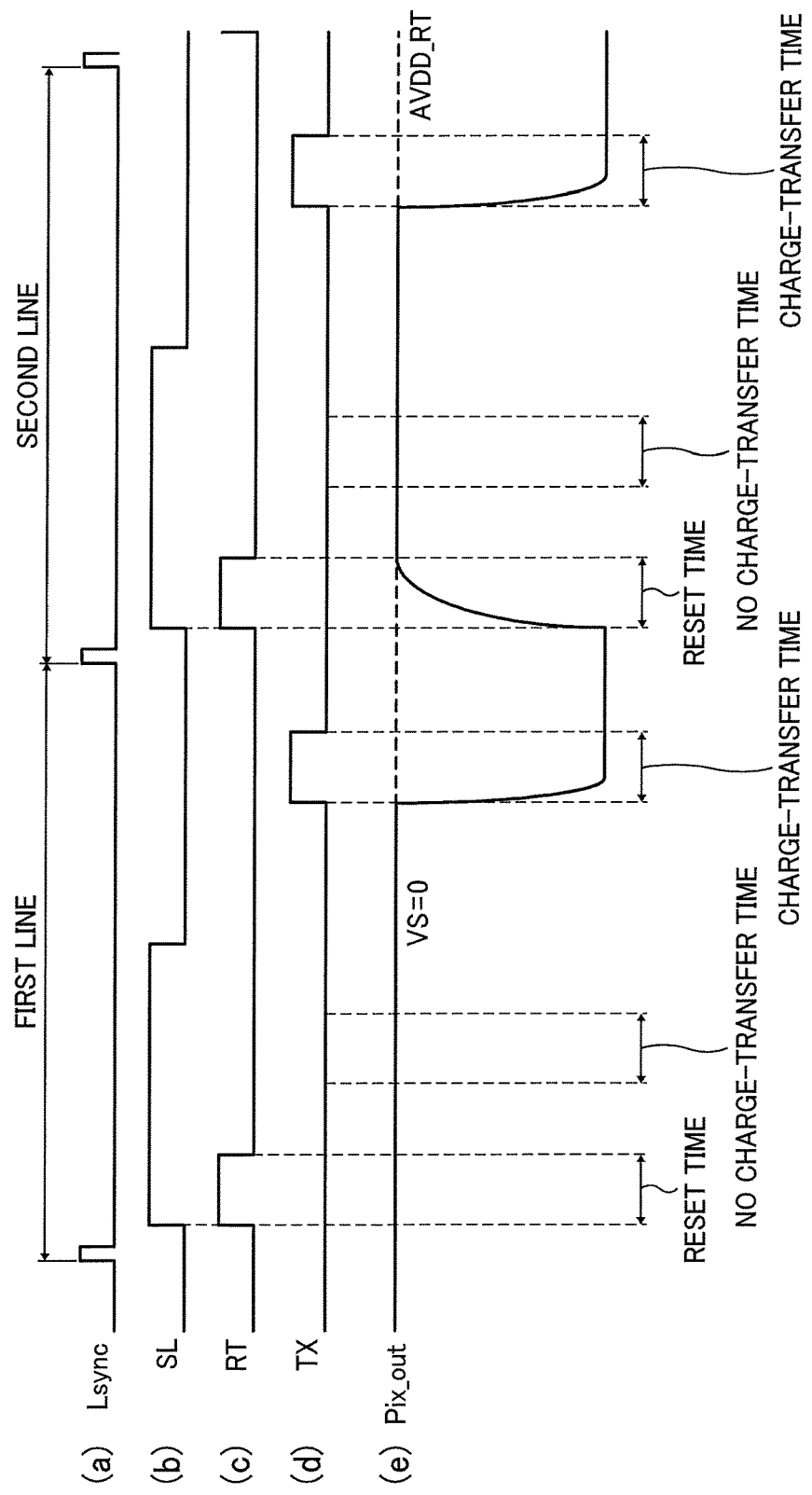
FIG. 18 is a timing chart of a signal of the photoelectric conversion element of FIG. 5 in the pseudo light shielding mode of a MFP according to a third embodiment.

Hereinafter, a description is given of a MFP according to a third embodiment of the present disclosure. FIG. 18 illustrates timing charts of signals of the components (see FIG. 6) of the photoelectric conversion element 56 in the MFP according to the third embodiment in the pseudo light shielding mode. Same as FIG. 17, FIG. 18(a) is a timing chart of a line synchronous signal (Lsync) for one line. FIG. 18(b) is a timing chart of a switch control signal (SL) to on-off control the switch SL. FIG. 18(c) is a timing chart of a reset signal (RT) to on-off control the reset switch RT to reset the electrical potential in the floating diffusion FD to a rest electrical potential AVDD_RT. FIG. 18(d) is a timing chart of a transfer control signal (TX) to on-off control the charge-transfer switch TX to transfer charges accumulated in the photodiode PD to the floating diffusion FD. FIG. 18(e) is an illustration of the timing and level of the image signal (Pix_out) output from the pixel-signal generation circuit 61 for a pixel.

The photodiode PD, which continues to accumulate charges, reaches the saturation level, thereby to cause leakage of charges or excessive output, resulting in production of defective images. To handle such circumstances, in the MFP according to the third embodiment in the pseudo light shielding mode, the timing-signal generator 57 of the photoelectric conversion element 56 asserts a transfer control signal (TX) as illustrated in FIG. 18(b) while the timing-signal generator 57 negates a switch control signal (SL) as illustrated in FIG. 18(b) and no dark-time image signal is output.

Such a configuration enables reading, from the photoconductor PD, charges accumulated in the photodiode PD while preventing the charges from being output to the subsequent circuit because of the negation of the switch control signal (LS). That is, such a configuration discards charges accumulated in the photodiode PD once (or multiple times) for each scan line at the timing at which no image signal is output to the subsequent circuit. This prevents, for example, the saturation of the photodiode PD while exhibiting the same advantageous effects as those of the above-described embodiments.

The third embodiment differs from the above-described embodiments in such a point. The same description and advantageous effects apply to the third embodiment as those of the first embodiment as described above, except for a discard of charges accumulated in the photodiode PD once (or multiple times) for each scan line at the timing at which no image signal is output to the subsequent circuit.

Fourth Embodiment

Figure 19:
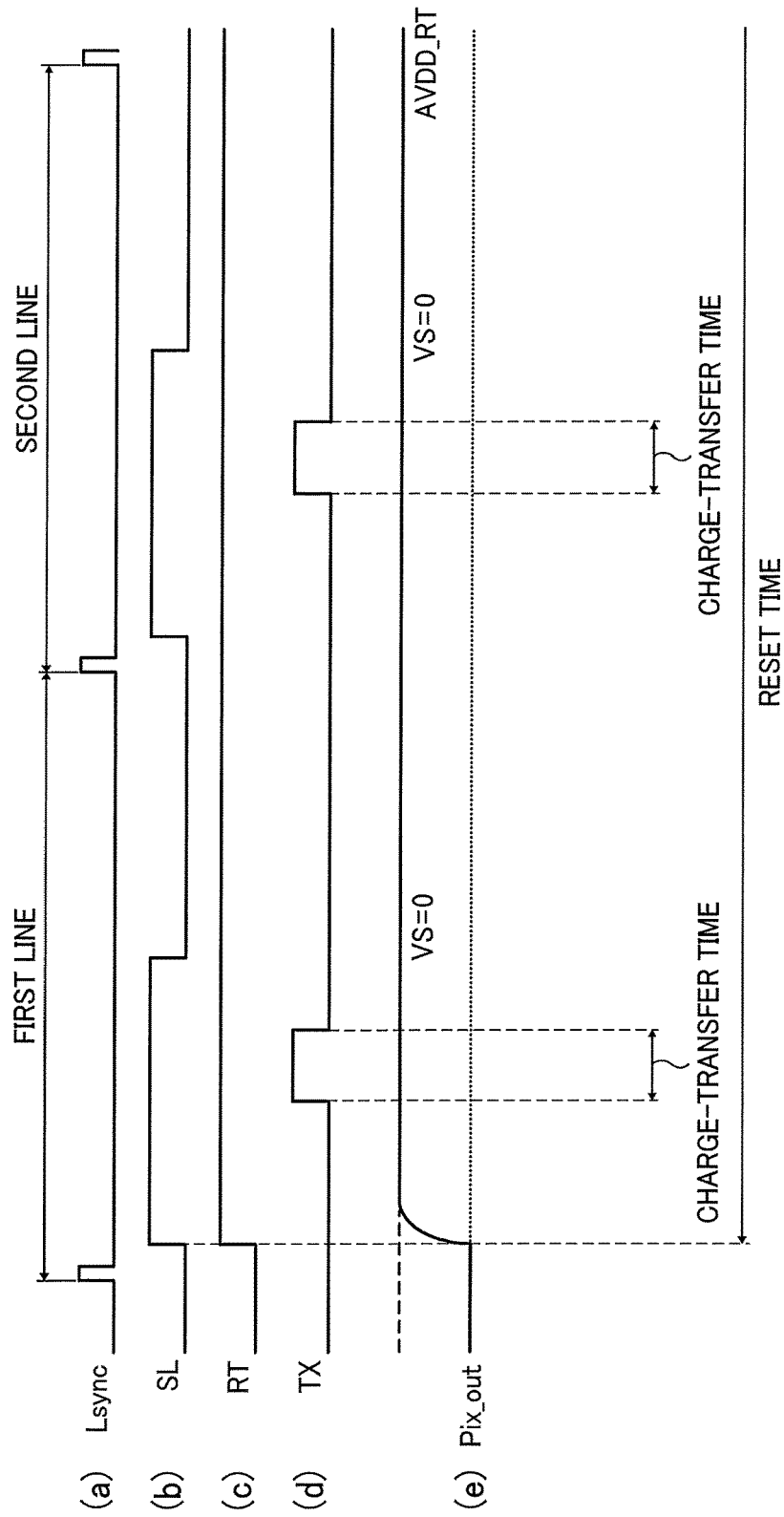
FIG. 19 is a timing chart of a signal of the photoelectric conversion element of FIG. 5 in the pseudo light shielding mode of a MFP according to a fourth embodiment.

Hereinafter, a description is given of a MTP according to a fourth embodiment of the present disclosure. FIG. 19 illustrates timing charts of signals of the components (see FIG. 6) of the photoelectric conversion element 56 in the MFP according to the fourth embodiment in the pseudo light shielding mode. Same as FIG. 18, FIG. 19(e) is a timing chart of a line synchronous signal (Lsync) for one line. FIG. 19(b) is a timing chart of a switch control signal (SL) to on-off control the switch SL. FIG. 19(c) is a timing chart of a reset signal (RT) to on-off control the reset switch RT to reset the electrical potential in the floating diffusion FD to a rest electrical potential AVDD_RT. FIG. 19(d) is a timing chart of a transfer control signal (TX) to on-off control the charge-transfer switch TX to transfer charges accumulated in the photodiode PD to the floating diffusion FD. FIG. 19(e) is an illustration of the timing and level of the image signal (Pix_out) output from the pixel-signal generation circuit 61 for a pixel.

In the MFP according to the fourth embodiment, the timing-signal generator 57 of the photoelectric conversion element 56 continues to assert the reset signal (RT) all the time as illustrated in FIG. 19(c). The timing-signal generator 57 asserts a transfer control signal (TX) at the timing that corresponds to the charge-transfer time in the regular reading mode. This configuration allows the output image signal (Pix_out) to remain "VS=0" even during the charge-transfer time because the reset signal (RT) line represents a low impedance line. This configuration further enables obtaining a dark-time image signal while detecting and correcting a defective pixel that causes RTS noise. Further, the same advantageous effects as those of the above-described embodiments are exhibited.

The fourth embodiment differs from the above-described embodiments in such a point. The same description and advantageous effects apply to the fourth embodiment as those of the first embodiment as described above.

Variation

Various examples of a control method in the pseudo light shielding mode according to the embodiments of the present disclosure are described above. However, no limitation is not intended herein. In some embodiments, a different method is adopted. The control method in the pseudo light shielding mode according to each embodiment of the present disclosure lies in the concept of obtaining a dark-time image signal with the floating diffusion FD maintaining a reset electrical potential (=reference electrical potential). Accordingly, in some embodiments, an electrical potential equal to the reset electrical potential is externally applied to the floating diffusion FD instead of the above-described configuration as long as the above-described concept is achieved. Alternatively, in some other embodiments, another switch different from the charge-transfer switch TX to disrupt the photodiode PD is disposed.

Fifth Embodiment

Hereinafter, a description is given of a MFP according to a fifth embodiment of the present disclosure. The MFP according to the fifth embodiment is an example in which the noise detector 71 in FIGS. 13 and 14 performs the noise detection operation as described below based on the above-described dark-time image signal. The fifth embodiment differs from the above-described embodiments in such a point. The following describes the different point, and the same description and advantageous effects are omitted.

Noise Detection Operation

Figure 20:
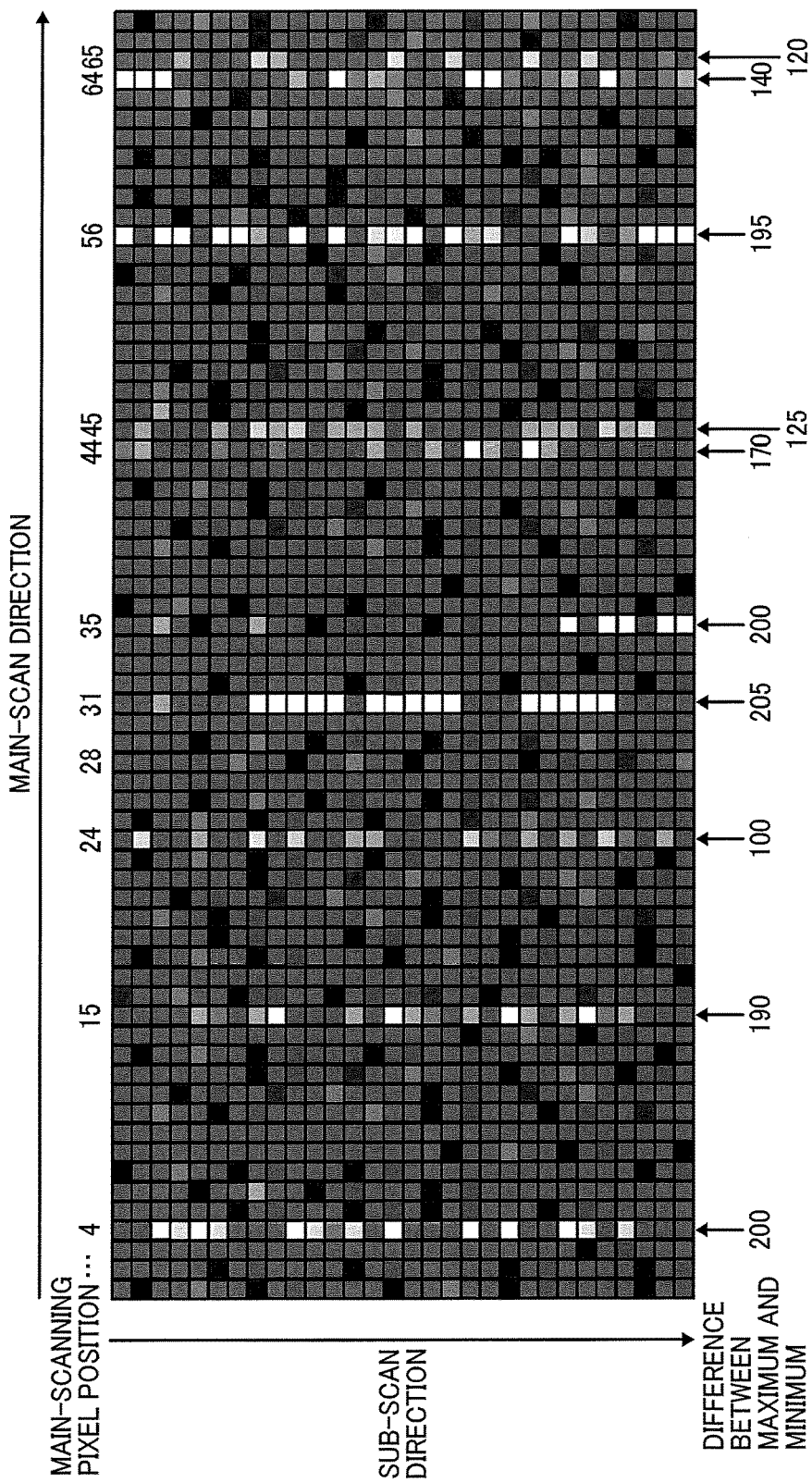
FIG. 20 is an illustration of an example of an image in which defective pixels appear.

FIG. 20 is an illustration of an example of an image in which defective pixels appear. In FIG. 20, pixels of numbers (Nos.) 4, 15, 24, 28, 31, 35, 44, 45, 56, 64, and 65 are arranged along the main-scan direction, which represents defective pixels that cause RTS noise. As illustrated in FIG. 20, when there is a defective pixel, a defective image appear in the form of a line along the sub-scan direction. Since RTS noise occurs randomly in time, a defective image may appear in a clear line or in a dotted line. The noise detector 71 of the MFP according to the fifth embodiment detects defective pixels from the pixels arranged along the main-scan direction, based on the above-described dark-time pixel signals.

More specifically, the noise detector 71 first obtains dark-time image signals for a predetermined plurality of lines, and calculates the difference between a maximum value and a minimum value of pixel values in the sub-scan direction for each pixel. Note that, the number of lines for obtaining dark-time image signals, the position of a pixel to start obtaining a dark-time image signal (a starting pixel position in the main-scan direction), and the position of a pixel to end obtaining a dark-time image signal (an ending pixel position in the main-scan direction) are optional according to a design.

Subsequently, the noise detector 71 compares the calculated difference between the maximum value and the minimum value with a predetermined threshold value to determine whether a pixel corresponding to the pixel values, from which the difference between the maximum value and the minimum value is calculated, is a defective pixel. The noise detector 71 determines that a pixel is a defective value when the difference between the maximum value and the minimum value is greater than or equal to the threshold value. The noise detector 71 stores address data representing a physical address of the defective pixel in the photoelectric conversion element 56, the pixels values, and the calculated difference between the maximum value and the minimum value in the memory 72 illustrated in FIGS. 13 and 14. In the example of FIG. 20, the difference values between the maximum value and the minimum value for the pixels of No. 4, No. 15, No. 24, No. 28, No. 31, No. 35, No. 44, No. 45, No. 56, No. 64, No. 65 are 200, 190, 100, 205, 200, 170, 125, 195, 140, and 120, respectively. As described above, the noise detector 71 detects defective pixels from the pixels along the main-scan direction. In such a configuration, detecting RTS noise enables identifying a defective pixel.

Figure 21:
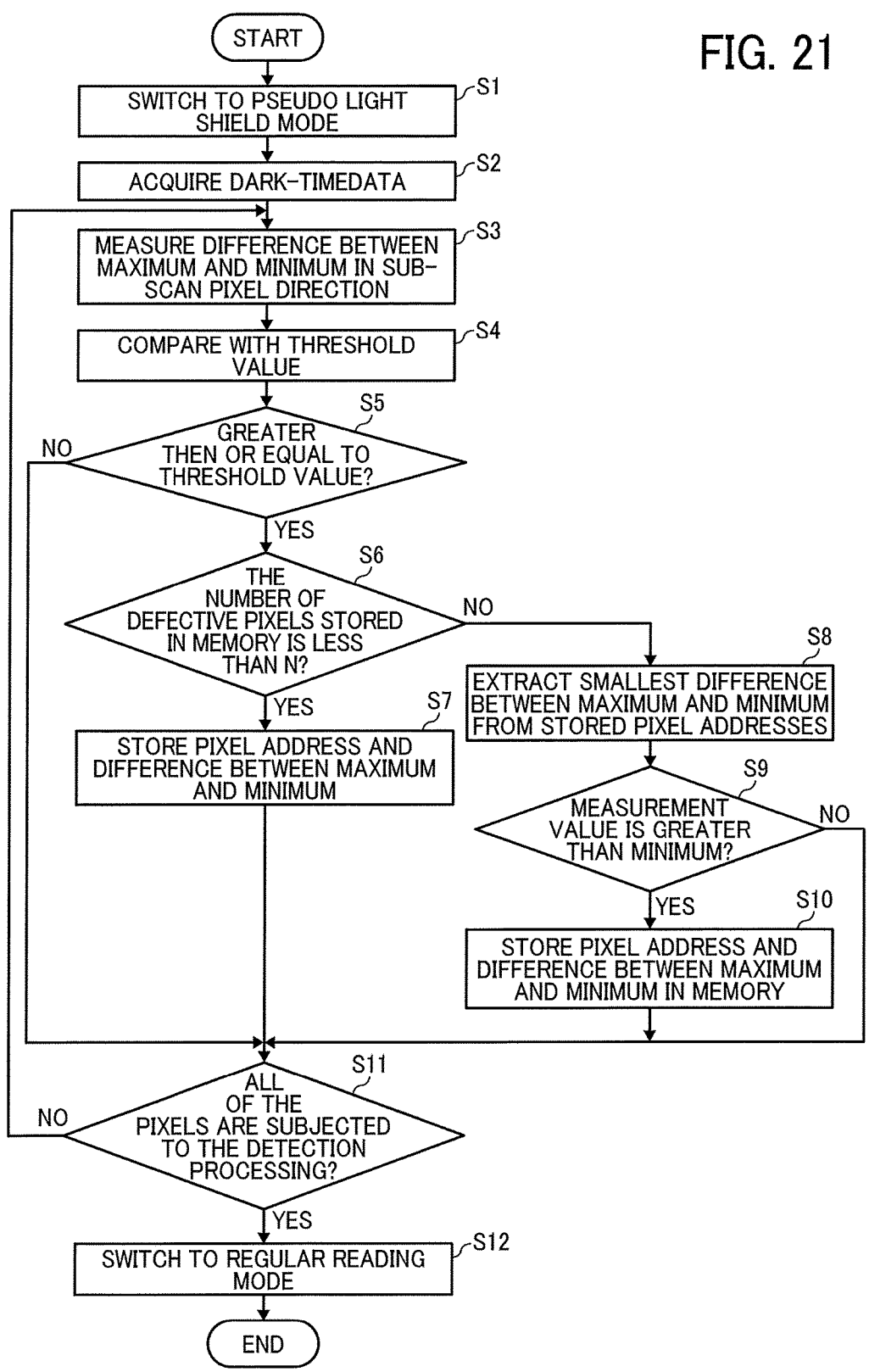
FIG. 21 is a flowchart of a noise detection operation of a noise detector in a MFP according to a fifth embodiment.

FIG. 21 is a flowchart of noise detection processing of the noise detector 71, which is controlled by the CPU 41 in FIG. 3 according to the reading control program. In FIG. 21, the CPU 41 in FIG. 3 sets the reading mode to the pseudo light shielding mode in step S1. In step S2, the CPU 41 controls the timing-signal generator 57 and the noise detector 71 according to the reading control program to obtain dark-time image signals for a predetermined plurality of lines.

In step S3, the CPU 41 controls the noise detector 71 to calculate the difference between a maximum value and a minimum value of pixel values along the sub-scan direction of each pixel. In step S4, the CPU 41 controls the noise detector 71 to compare the calculated difference value with a threshold value. In step S5, the CPU 41 controls the noise detector 71 to determine whether the calculated difference value is greater than or equal to the threshold value. When the difference between the maximum value and the minimum value is less than the threshold value (No in step S5), the process proceeds to step S11. In step S11, the CPU 41 controls the noise detector 71 to determine whether the noise detection processing has been performed on all of the pixels arranged in the main-scan direction. When there is still any pixel (remaining pixel) to be subjected to the noise detection processing (No in step S11), the process returns to step S3 to calculate the difference between the maximum value and the minimum value for the remaining pixel, and compare the calculated value with the threshold value (step S4).

When the noise detector 71 determines that the noise detection processing has been performed on all of the pixels along the main-scan direction (Yes in step S11), the process proceeds to step S12. In step S12, the CPU 41 switches the reading mode from the pseudo light shielding mode to the regular reading mode, and ends the noise detection processing in FIG. 21.

When the noise detector 71 determines that the difference between the maximum value and the minimum value is greater than or equal to the threshold value (Yes in step S5), the process proceeds to step S6. In step S6, the noise detector 71 determines whether the number of defective pixels stored in the memory 72 in FIGS. 13 and 14 as data is less than N. As RTS noise occurs randomly in time, the position of a defective pixel varies. The capacity of the memory 72 has the upper limit. That is, the memory 72 has a limit for storable amount of address data and the differences between the maximum value and the minimum value of defective pixels. This is why the noise detector 71 detects the number of defective pixels of which data is currently stored in the memory 72 to determine whether the number of defective pixels is less than N in step S6.

When the memory 72 affords the number of storable defective pixels (the number of defective pixels stored in the memory 72 is less than N, Yes in step S6), the process proceeds to step S7. In step S7, the noise detector 71 stores the address data and the difference between maximum and minimum of a defective pixel in the memory 72. The process proceeds to step S11.

When the memory 72 does not afford the number of storable defective pixels (the number of defective pixels stored in the memory 72 is not less than N, No in step S6), the process proceeds to step S8. In step S8, the noise detector 71 detects a smallest difference between maximum and minimum from the difference values between a maximum value and a minimum value stored in the memory 72. In step S9, the noise detector 71 subsequently determines whether the difference between a maximum value and a minimum value of a current defective pixel that is to be stored in the memory 72 is greater than the smallest difference between the maximum value and the minimum value stored in the memory 72.

In this case, when the difference between a maximum value and a minimum value of a current defective pixel that is to be stored in the memory 72 is smaller than the smallest difference between the maximum value and the minimum value stored in the memory 72, the current defective pixel does not have an adverse effect on an image. Accordingly, when the noise detector 71 determines that the difference between a maximum value and a minimum value of a current defective pixel to be stored in the memory 72 is smaller than the smallest difference between the maximum value and the minimum value stored in the memory 72 (No in step S9), the noise detector 71 discards the difference between maximum and minimum of the current defective pixel, without storing the value in the memory 72. The process proceeds to step S11.

When the difference between a maximum value and a minimum value of a current defective pixel that is to be stored in the memory 72 is larger than the smallest difference between the maximum value and the minimum value stored in the memory 72, the current defective pixel has an adverse effect on an image. Accordingly, when the noise detector 71 determines that the difference between a maximum value and a minimum value of the current defective pixel to be stored in the memory 72 is larger than the smallest difference between the maximum value and the minimum value stored in the memory 72 (Yes in step S9), the noise detector 71 deletes the smallest difference between the maximum value and the minimum value from the memory 72 so as to obtain a storage area, and stores the difference between the maximum value and the minimum value of the current defective pixel in the obtained storage area in step S10. The process proceeds to step S11.

That is, the noise detector 71 replaces the smallest difference between the maximum value and the minimum value stored in the memory 72 with the difference between the maximum value and the minimum value of the current defective pixel. This configuration enables detecting a defective pixel, using a small memory capacity. This configuration further enables adapting to the fluctuations in RTS noise with time by replacing the address data of defective pixels in the memory 72 with fresh data based on the difference between the maximum value and the minimum value. In addition, the configuration according to the fifth embodiment exhibits the same advantageous effects as those of the above-described embodiment.

Sixth Embodiment

Next, a description is given of a MFP according to a sixth embodiment. The noise detection processing is performed on pixels corresponding to an effective pixel area of the image out of the pixels in the main-scan direction. The MFP according to the sixth embodiment is an example in which a user or an administrator arbitrarily sets a noise detection area.

Figure 22:
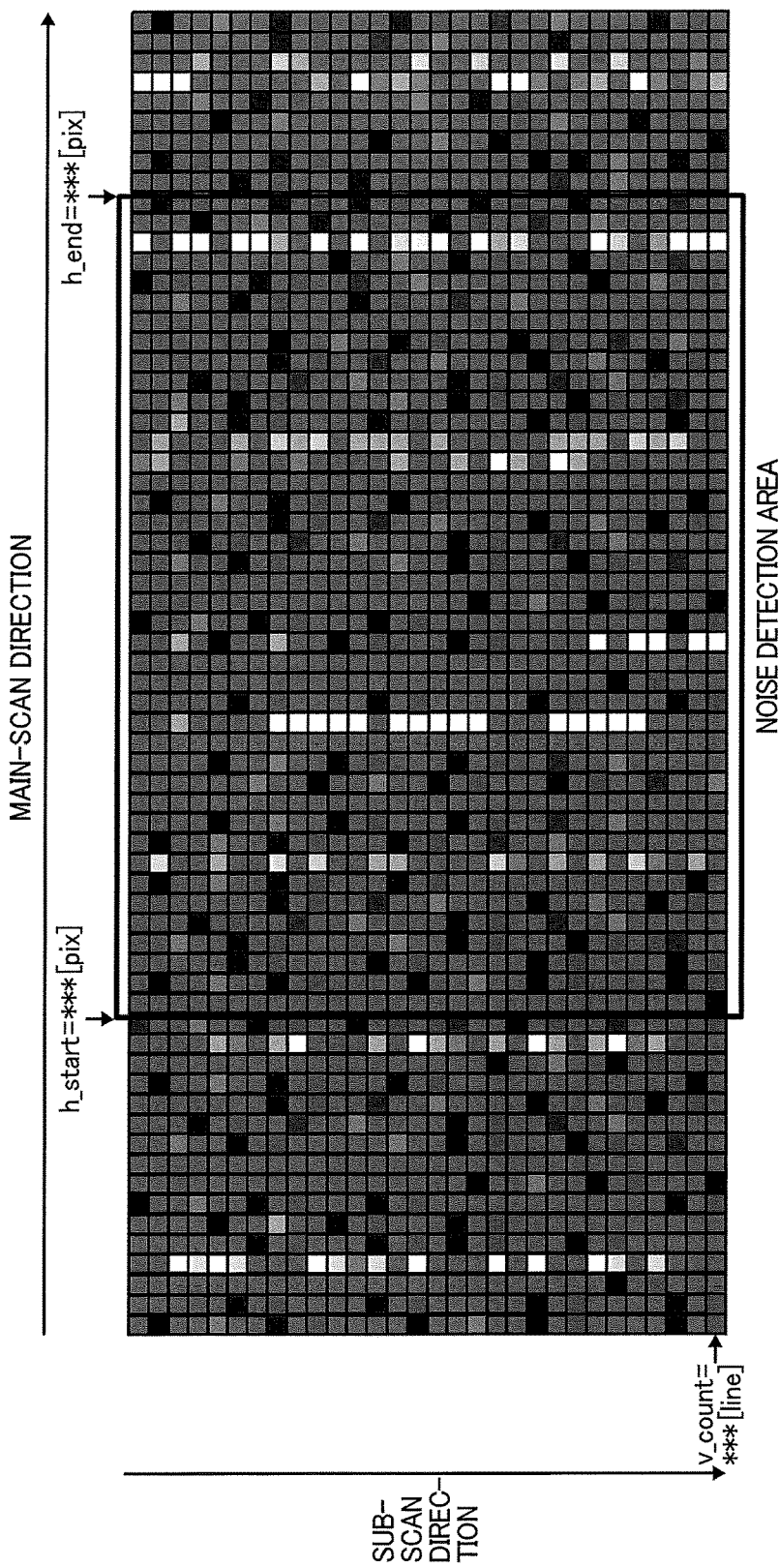
FIG. 22 is an illustration of a setting operation of a noise detection area in a MFP according to a sixth embodiment.

More specifically, the user or the manager designates a start position (h_start) and an end position (h_end) of the noise detection processing in the main-scan direction as illustrated in FIG. 22, using, e.g., the control panel 47 illustrated in FIG. 3. The CPU 41 stores the address data of the pixel on the photoelectric conversion element 56 corresponding to the start position of the noise detection processing designated by, e.g., the user and the address da of the pixel on the photoelectric conversion element 56 corresponding to the end position of the noise detection processing in a storage unit such as the RAM 43 or the HDD 44. The CPU 41 controls the timing-signal generator 57 to control each of the above-described units involved in the noise detection processing, so as to detect noise (defective pixels) in an area (effective pixel area) between the start position (h_start) and the end position (h_end). Such a configuration enables adjusting an area to be detected for noise, thereby performing the noise detection processing in any desired noise detection area. In addition to such an advantageous effect, the configuration according to the sixth embodiment exhibits the same advantageous effects as those of the above-described embodiments.

In some embodiments, the number of lines for noise detection (noise detection lines) is also arbitrarily set by, e.g., a user. In this case, the CPU 41 stores the number of noise detection lines (v_count) in the sub-scan direction set by, e.g., the user in the storage unit such as the RAM 43 or the HDD 44 for use in the noise detection processing. This configuration enables adjusting the accuracy of noise detection and the time for noise processing, and further exhibits the same advantageous effects as those of the above-described embodiments.

The sixth embodiment differs from the above-described embodiments in such a point. The same description and advantageous effects apply to the fourth embodiment as those of the first embodiment as described above, except for the points.

Seventh Embodiment

Next, a description is given of a MFP according to a seventh embodiment. The MFP according to the seventh embodiment performs the above-described noise detection processing upon starting up and at the completion of reading a document. The seventh embodiment differs from the above-described embodiments in such a point. The following describes the different point, and the same description and advantageous effects are omitted.

Figure 23:
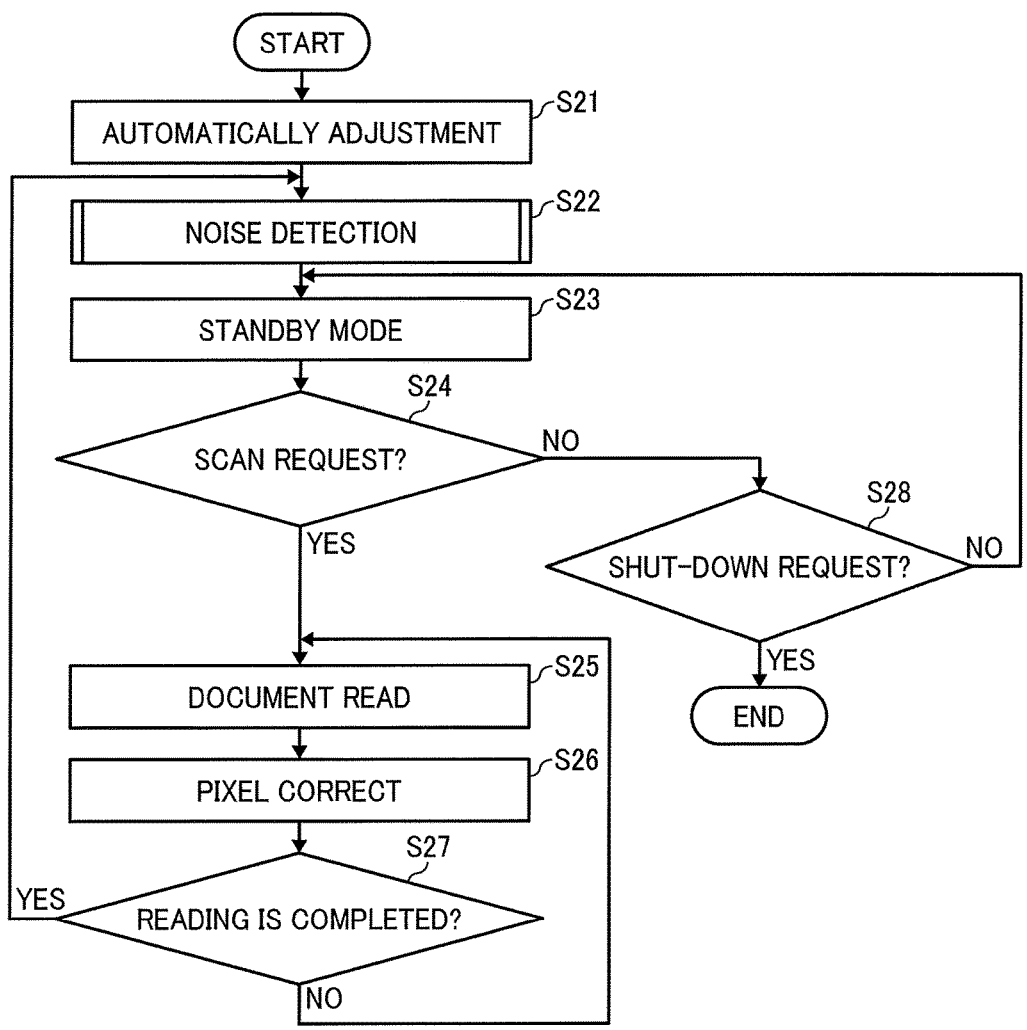
FIG. 23 is a flowchart of a document reading operation of a MFP according to a seventh embodiment.

FIG. 23 is a flowchart of a document reading operation (document reading processing) of the MFP according to the seventh embodiment. First, when the main power source of the MFP is turned on, the CPU 41 controls the light source 55 to emit light to the reference white board 23 in step S21. Then, the photoelectric conversion element 56 receives the light reflected from the reference white board 23. The CPU 41 adjusts the brightness of the light source 55 and performs various adjustments such as gain adjustment of the reading level (automatic adjustment) based on the light received by the photoelectric conversion element 56.

In step S22, the CPU 41 controls the timing-signal generator 57 to obtain the above-described dark-time image data (data that is equivalent to data obtained without exposure to external light) and perform the noise detection processing by detecting a defective pixel based on the obtained dark-time image data. In step S23, the CPU 41 subsequently waits for a user's instruction to perform, e.g., scanning (standby mode).

In step S24, the CPU 41 determines the presence or absence of a request (scan request) for scanning, e.g., a document by monitoring an operation of the control panel 47. When the CPU 41 determines the absence of the scan request (No in step S24), the process proceeds to step S28. In step S28, the CPU 41 determines the presence or absence of a request (shut-down request) for shutting down the MFP. When the CPU 41 determines the presence of the shut-down request (Yes in step S28), the CPU 41 controls to turn off the main power source of the MFP and ends the document reading processing in FIG. 23. When the CPU 41 determines the absence of the scan request (No in step S24), and further determines the absence of the shut-down request (No in step S28), the process returns to step S23.

When the CPU 41 determines the presence of the scan request (Yes in step S24), the process proceeds to step S25. In step S25, the CPU 41 controls to read a document. In step S26, the CPU 41 controls the pixel corrector 73 to correct a defective pixel based on the address data of a defective pixel detected in step S22. Examples of the processing for correcting a defective pixel include, for example, a linear interpolation method, a cubic method, and a pattern matching method.

In step S27, the CPU 41 determines whether all the documents has been readout. When the CPU 41 makes a negative determination (No in step S27), the process returns to step S25 to read a document. When the CPU 41 makes an affirmative determination (Yes in step S27), the process returns to step S22 to perform the noise detection processing again. This configuration enables performing the correction processing on a next document to be read based on address data of a newly detected defective pixel.

As described above, the MFP according to the seventh embodiment performs the noise detection processing upon starting up and at the completion of reading a document (an example of a certain operation). This configuration enables performing the noise detection processing when the MFP has a low temperature in the initial state and when the MFP having performed a document reading operation reaches a high temperature with time. Thus, the configuration according to the seventh embodiment enables performing the correction processing on a defective pixel that occurs with changes in temperature based on address data of the defective pixel stored in the memory 72. The configuration further exhibits the same advantageous effects as those of the above-described embodiments. In some embodiments, the nose detection process is performed at any other timings other than upon starting up of the MPF and at the completion of reading a document.

Eighth Embodiment

Next, a description is given of a MFP according to an eighth embodiment. The MFP according to the eighth embodiment performs the above-described noise detection processing upon starting up and at the completion of reading a document. Note that the eighth embodiment differs from the above-described embodiments in such a point. The following describes the different point, and the same description and advantageous effects are omitted.

Figure 24:
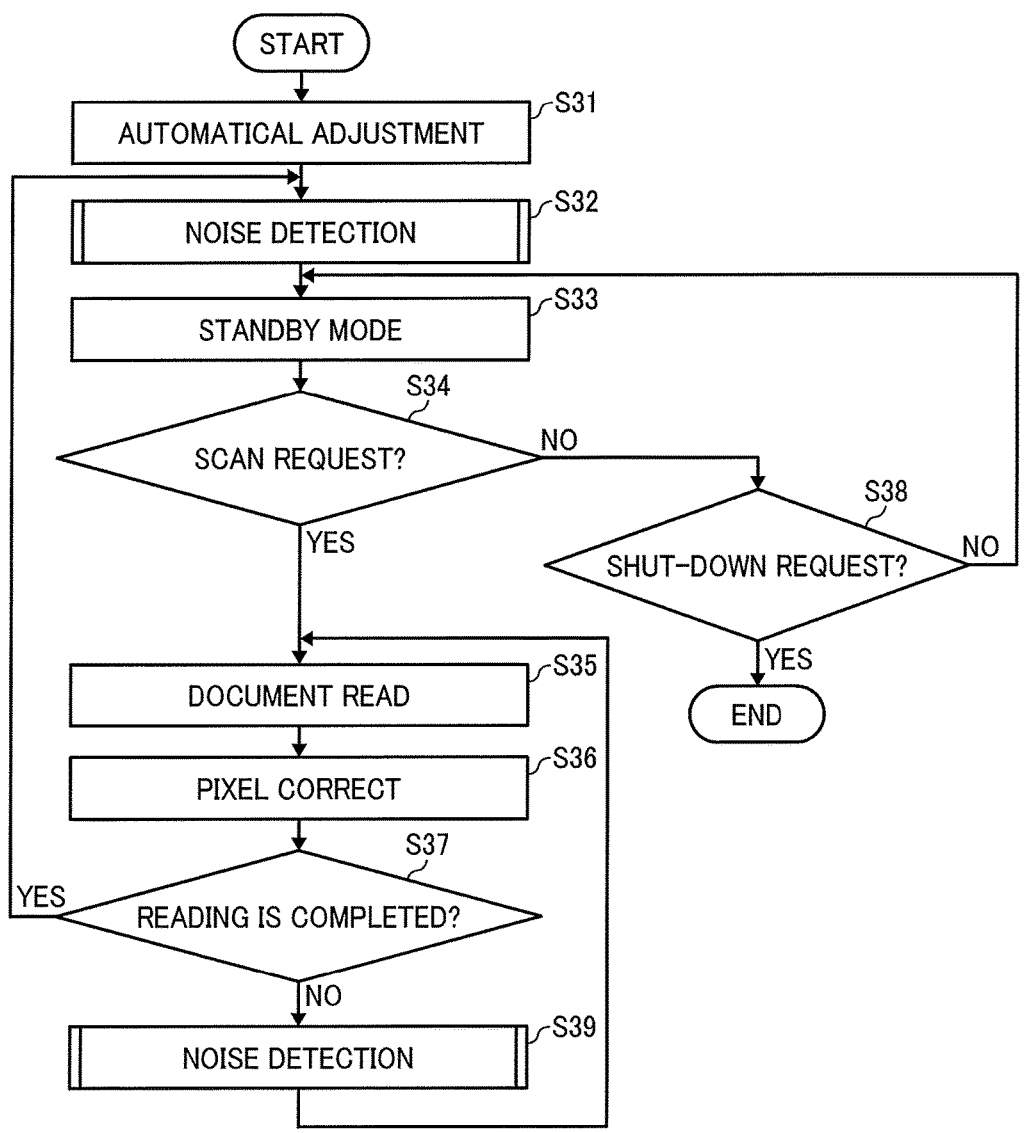
FIG. 24 is a flowchart of a document reading operation of a MFP according to an eighth embodiment.

FIG. 24 is a flowchart of document reading processing (a document reading operation) of the MFP according to the eight embodiment. First, when the main power source of the MFP is turned on, the CPU 41 controls the light source 55 to emit light to the reference white board 23 in step S21. Then, the photoelectric conversion element 56 receives the light reflected from the reference white board 23. The CPU 41 adjusts the brightness of the light source 55 and performs various adjustments such as gain adjustment of the reading level (automatic adjustment) based on the light received by the photoelectric conversion element 56.

In step S32, the CPU 41 controls the timing-signal generator 57 to obtain the above-described dark-time image data (data that is equivalent to data obtained without exposure to external light) and perform the noise detection processing by detecting a defective pixel based on the obtained dark-time image data. In step S33, the CPU 41 subsequently waits for a user's instruction to perform, e.g., scanning (standby mode).

In step S34, the CPU 41 determines the presence or absence of a request (scan request) for scanning, e.g., a document by monitoring an operation of the control panel 47. When the CPU 41 determines the absence of the scan request (No in step S34), the process proceeds to step S38. In step S38, the CPU 41 determines the presence or absence of a request (shut-down request) for shutting down the MFP. When the CPU 41 determines the presence of the shut-down request (Yes in step S38), the CPU 41 controls to turn off the main power source of the MFP and ends the document reading processing in FIG. 24. When the CPU 41 determines the absence of the scan request (No in step S34), and further determines the absence of the shut-down request (No in step S38), the process returns to step S33.

When the CPU 41 determines the presence of the scan request (Yes in step S34), the process proceeds to step S35. In step S35, the CPU 41 controls to read a document. In step S36, the CPU 41 controls the pixel corrector 73 to correct a defective pixel based on the address data of a defective pixel detected in step S32. Examples of the processing for correcting a defective pixel include, for example, a linear interpolation method, a cubic method, and a pattern matching method.

In step S37, the CPU 41 determines whether all the documents has been readout. When the CPU 41 makes an affirmative determination (Yes in step S37), the process returns to step S32 to read a document. This configuration enables performing the correction processing on a next document to be read based on address data of a newly detected defective pixel.

When the CPU 41 makes a negative determination (No in step S37), the process returns to step S39 to perform the noise detection processing again. This configuration enables performing the correction processing on a next document to be read based on address data of a newly detected defective pixel. That is, the MFP according to the eighth embodiment performs the noise detection processing based on, e.g., address data of a newly detected defective pixel upon each completion of reading a document that is an example of a certain operation.

In other words, the MFP according to the eighth embodiment newly performs the noise detection processing at each time of reading a document. This configuration enables a frequent noise detection, thereby more accurately correcting noise that changes with time. In addition, the configuration according to the eighth embodiment exhibits the same advantageous effects as those of the above-described embodiments.

Although the exemplary embodiments of the disclosure have been described and illustrated above, such description is not intended that the disclosure be limited to the illustrated embodiments.

Numerous additional modifications and variations are possible in light of the above teachings. It is therefore to be understood that within the scope of the appended claims, the embodiments may be practiced otherwise than as specifically described herein. For example, elements and/or features of different illustrative embodiments may be combined with each other and/or substituted for each other within the scope of this disclosure and appended claims.

What is claimed is:

1. A photoelectric conversion device comprising:
a generation circuit to generate an image signal according to an intensity of light being input; and
controller circuitry to control the generation circuit to generate a dark-time image signal equivalent to an image signal generated by the generation circuit without exposure to external light, wherein
the controller circuitry controls the generation circuit to suspend outputting an image signal so as to generate the dark-time image signal, and
the controller circuitry controls the generation circuit to output a reset electrical potential a plurality of times during a time period of outputting the dark-time image signal.

2. The photoelectric conversion device according to claim 1,
wherein the controller circuitry controls the generation circuit to discard the image signal accumulated in the generation circuit, at least one time during a suspension of outputting the dark-time image signal.

3. The photoelectric conversion device according to claim 1,
wherein the controller circuitry controls the generation circuit to output a reset electrical potential as data corresponding to the dark-time image signal, the reset electrical potential having a low impedance.

4. The photoelectric conversion device according to claim 1, further comprising:
a memory to store data; and
detector circuitry to:
detect a defective pixel that outputs an image signal having a pixel value outside a predetermined range, from a plurality of pixels of the generation circuit; and
store the pixel value and address data of the defective pixel within the generation circuit, in the memory,
wherein, when another defective pixel, which has been detected by the detector circuitry, has a pixel value greater than a smallest pixel value among pixel values of defective pixels stored in the memory, the detector circuitry replaces the smallest pixel value with the pixel value of the another defective pixel in the memory.

5. The photoelectric conversion device according to claim 4,
wherein the controller circuitry controls the detector circuitry to detect the defective pixel in starting up the device on which the photoelectric conversion device is mounted or in completion of a certain operation of the device.

6. The photoelectric conversion device according to claim 4,
wherein the controller circuitry controls the detector circuitry to detect the defective pixel at each time of completion of a certain operation of the device on which the photoelectric conversion device is mounted.

7. A photoelectric conversion method comprising:
generating an image signal according to an intensity of light received by a generation circuit; and
controlling the generation circuit to generate a dark-time image signal equivalent to an image signal generated by the generation circuit without exposure to external light, wherein
the controlling controls the generation circuit to suspend outputting an image signal so as to generate the dark-time image signal, and
the controlling controls the generation circuit to output a reset electrical potential a plurality of times during a time period of outputting the dark-time image signal.

8. The photoelectric conversion method according to claim 7, further comprising:
detecting a defective pixel that outputs an image signal having a pixel value outside a predetermined range, from a plurality of pixels of the generation circuit;
storing the pixel value and address data of the defective pixel within the generation circuit, in a memory; and
when another defective pixel, which has been detected by the detecting, has a pixel value greater than a smallest pixel value among pixel values of defective pixels stored in the memory, replacing the smallest pixel value with the pixel value of the another defective pixel in the memory.

9. The photoelectric conversion method according to claim 8,
   wherein the detecting detects the defective pixel in starting up the device on which the photoelectric conversion device is mounted or in completion of a certain operation of the device.

10. The photoelectric conversion method according to claim 8,
    wherein the detecting detects the defective pixel at each time of completion of a certain operation of the device on which the photoelectric conversion device is mounted.

11. An image forming apparatus comprising:
    a document tray to place a document;
    a light source to emit light to the document; and
    a photoelectric conversion device to receive the light reflected by the document,
    the photoelectric conversion device including:
       a generation circuit to generate an image signal according to an intensity of the light received, and
       controller circuitry to control the generation circuit to generate a dark-time image signal equivalent to an image signal generated by the generation circuit without exposure to light coming from outside of the image forming apparatus, wherein
    the controller circuitry controls the generation circuit to suspend outputting an image signal so as to generate the dark-time image signal, and
    the controller circuitry controls the generation circuit to output a reset electrical potential a plurality of times during a time period of outputting the dark-time image signal.

\* \* \* \* \*